US008119737B2

(12) United States Patent
Inada et al.

(10) Patent No.: US 8,119,737 B2
(45) Date of Patent: Feb. 21, 2012

(54) ADHESIVE COMPOSITION, PROCESS FOR PRODUCING THE SAME, ADHESIVE FILM USING THE SAME, SUBSTRATE FOR MOUNTING SEMICONDUCTOR AND SEMICONDUCTOR DEVICE

(75) Inventors: Teiichi Inada, Tsukuba (JP); Keiji Sumiya, Hitachinaka (JP); Takeo Tomiyama, Tsukuba (JP); Tetsurou Iwakura, Tsukuba (JP); Hiroyuki Kawakami, Tsukuba (JP); Masao Suzuki, Tsukuba (JP); Takayuki Matsuzaki, Ichihara (JP); Youichi Hosokawa, Ichihara (JP); Keiichi Hatakeyama, Tsukuba (JP); Yasushi Shimada, Tsukuba (JP); Yuuko Tanaka, Shimotsuma (JP); Hiroyuki Kuriya, Shimodate (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/084,773

(22) Filed: Apr. 12, 2011

(65) Prior Publication Data

US 2011/0187006 A1 Aug. 4, 2011

Related U.S. Application Data

(60) Division of application No. 12/900,092, filed on Oct. 7, 2010, now Pat. No. 7,947,779, which is a division of application No. 12/414,420, filed on Mar. 30, 2009, now abandoned, which is a continuation of application No. 11/476,725, filed on Jun. 29, 2006, now abandoned, which is a continuation of application No. 10/203,790, filed as application No. PCT/JP01/01065 on Feb. 15, 2001, now abandoned.

(30) Foreign Application Priority Data

Feb. 15, 2000 (JP) .................................. 2000-41346
Nov. 16, 2000 (JP) ................................ 2000-349737
Nov. 16, 2000 (JP) ................................ 2000-349739

(51) Int. Cl.
*C08L 33/14* (2006.01)
*C08L 63/02* (2006.01)
*C08L 63/04* (2006.01)
*H05K 1/03* (2006.01)
*H05K 3/46* (2006.01)

(52) U.S. Cl. ........ 525/109; 156/249; 156/297; 156/330; 250/259

(58) Field of Classification Search .................... None
See application file for complete search history.

(56) References Cited

U.S. PATENT DOCUMENTS

| | | | | |
|---|---|---|---|---|
| 3,496,042 A | * | 2/1970 | Wyness | 156/77 |
| 4,798,201 A | * | 1/1989 | Rawlings et al. | 602/52 |
| 5,024,880 A | * | 6/1991 | Veasley et al. | 428/317.5 |
| 5,202,361 A | * | 4/1993 | Zimmerman et al. | 522/120 |
| 5,294,668 A | | 3/1994 | Babu | |
| 5,356,993 A | * | 10/1994 | Erickson et al. | 525/89 |
| 5,519,177 A | * | 5/1996 | Wang et al. | 174/259 |
| 5,550,196 A | * | 8/1996 | Spence et al. | 525/314 |
| 5,965,269 A | * | 10/1999 | Inada et al. | 428/413 |
| 5,997,682 A | * | 12/1999 | Goodman et al. | 156/273.7 |
| 6,090,468 A | * | 7/2000 | Shimada et al. | 428/137 |
| 6,265,782 B1 | * | 7/2001 | Yamamoto et al. | 257/783 |
| 6,277,481 B1 | * | 8/2001 | Sugino et al. | 428/317.1 |
| 6,294,668 B1 | * | 9/2001 | Babu | 540/222 |
| 6,302,994 B1 | * | 10/2001 | Kamiya et al. | 156/320 |
| 6,303,219 B1 | * | 10/2001 | Sawamura et al. | 428/343 |
| 6,621,170 B2 | * | 9/2003 | Yamamoto et al. | 257/783 |
| 6,673,441 B1 | * | 1/2004 | Tanaka et al. | 428/355 EP |
| 6,838,170 B2 | * | 1/2005 | Tanaka et al. | 428/355 EP |
| 7,070,670 B2 | * | 7/2006 | Tomiyama et al. | 156/248 |
| 7,578,891 B2 | * | 8/2009 | Ookubo et al. | 148/33.3 |
| 2002/0096755 A1 | * | 7/2002 | Fukui et al. | 257/686 |
| 2006/0100315 A1 | * | 5/2006 | Inada et al. | 523/400 |
| 2006/0106166 A1 | * | 5/2006 | Inada et al. | 525/109 |

FOREIGN PATENT DOCUMENTS

| | | |
|---|---|---|
| EP | 819747 | 1/1998 |
| EP | 819747 A1 * | 1/1998 |
| JP | 61-138680 | 6/1986 |
| JP | 61-138680 A * | 6/1986 |
| JP | 63-297418 | 12/1988 |
| JP | 63-297418 A * | 12/1988 |
| JP | 04-223007 | 8/1992 |
| JP | 4-223007 A * | 8/1992 |
| JP | 5-171073 | 7/1993 |
| JP | 05-171073 | 7/1993 |
| JP | 5-171073 A * | 7/1993 |
| JP | 05-311144 | 11/1993 |
| JP | 5-315743 | 11/1993 |
| JP | 5-315743 A * | 11/1993 |
| JP | 06-104566 | 4/1994 |

(Continued)

*Primary Examiner* — Robert Sellers
(74) *Attorney, Agent, or Firm* — Antonelli, Terry, Stout & Kraus, LLP.

(57) ABSTRACT

Disclosed is an adhesive composition which includes (a) an epoxy resin, (b) a curing agent and (c) a polymer compound incompatible with said epoxy resin, and further optionally includes (d) a filler and/or (e) a curing accelerator. Also disclosed are a process for producing an adhesive composition, including mixing (a) the epoxy resin and (b) the curing agent with (d) the filler, followed by mixing the resultant mixture with (c) the polymer compound incompatible with the epoxy resin; an adhesive film including the above-mentioned adhesive composition formed into a film; a substrate for mounting a semiconductor including a wiring board and the above-mentioned adhesive film disposed thereon on its side where chips are to be mounted; and a semiconductor device which includes the above-mentioned adhesive film or the substrate for mounting a semiconductor.

10 Claims, 1 Drawing Sheet

FOREIGN PATENT DOCUMENTS

| | | | | |
|---|---|---|---|---|
| JP | 6-104566 A | * | 4/1994 | |
| JP | 08-165410 | | 6/1996 | |
| JP | 8-165410 | | 6/1996 | |
| JP | 8-165410 A | * | 6/1996 | |
| JP | 09-298220 | | 11/1997 | |
| JP | 9-298220 A | * | 11/1997 | |
| JP | 10-178070 | | 6/1998 | |
| JP | 10-178070 A | * | 6/1998 | |
| JP | 10-183086 | | 7/1998 | |
| JP | 10-183086 A | * | 7/1998 | |
| JP | 10-275891 | | 10/1998 | |
| JP | 10-275891 A | * | 10/1998 | |
| JP | 10-330724 | | 12/1998 | |
| JP | 10-338839 | | 12/1998 | |
| JP | 10-338839 A | * | 12/1998 | |
| JP | 11-001670 | | 1/1999 | |
| JP | 11-1670 A | * | 1/1999 | |
| JP | 11-140386 | | 5/1999 | |
| JP | 11-140386 A | * | 5/1999 | |
| JP | 11-209724 | | 8/1999 | |
| JP | 11-260838 | | 9/1999 | |
| JP | 11-260838 A | * | 9/1999 | |
| JP | 11-284114 | | 10/1999 | |
| JP | 11-284114 A | * | 10/1999 | |
| JP | 11-315189 | | 11/1999 | |
| JP | 2000-017240 | | 1/2000 | |
| KR | 1995-0009551 | | 8/1995 | |
| WO | WO 98/15975 | | 4/1998 | |
| WO | WO 00/78887 | | 12/2000 | |
| WO | WO 01/74962 | | 10/2001 | |
| WO | WO 01/74962 A1 | * | 10/2001 | |

* cited by examiner

ADHESIVE COMPOSITION, PROCESS FOR PRODUCING THE SAME, ADHESIVE FILM USING THE SAME, SUBSTRATE FOR MOUNTING SEMICONDUCTOR AND SEMICONDUCTOR DEVICE

This application is a Divisional application of application Ser. No. 12/900,092, filed Oct. 7, 2010 U.S. Pat. No. 7,947,779, which is a Divisional application of prior application Ser. No. 12/414,420, filed Mar. 30, 2009, abandoned, which is a Continuation application of application Ser. No. 11/476,725, filed Jun. 29, 2006, abandoned, which is a Continuation application of application Ser. No. 10/203,790, filed Aug. 14, 2002, abandoned, the contents of which are incorporated herein by reference in their entirety. Ser. No. 10/203,790 is a National Stage application filed under 35 USC 371 of International (PCT) Application No. PCT/JP01/01065, filed Feb. 15, 2001.

TECHNICAL FIELD

The present invention relates to an adhesive composition and a process for producing the same, an adhesive film using the adhesive composition, a substrate for mounting semiconductor and a semiconductor device. More specifically, it relates to an adhesive composition which can form an adhesive film that has enough heat resistance and moisture resistance required for mounting semiconductor elements having a large coefficient of thermal expansion on a substrate for mounting semiconductor, and can suppress an amount of volatilization at the time of use, a process for producing the same, an adhesive film using the adhesive composition, a substrate for mounting semiconductor, and a semiconductor device.

BACKGROUND ART

In recent years, the mounting density of electronic parts has been increased in accordance with the progress of electronic apparatuses, and new type of mounting methods, e.g., a method of mounting a semiconductor package having almost the same size to the size of a semiconductor chip, or mounting a bare chip, called chip scale package or chip size package (hereinafter, simply referred to as "CSP"), are being employed.

One of the most important characteristics for a mounted board having mounted thereon various electronic parts including a semiconductor element is reliability. In the reliability, interconnection reliability against thermal fatigue is directly responsible for the reliability of an apparatus using the mounted board and is therefore a very important issue.

One of the causes of lowering the interconnection reliability is a thermal stress due to the use of various materials having different coefficients of thermal expansion. Since the semiconductor element has a coefficient of thermal expansion as small as about 4 ppm/° C., whereas the wiring board on which electronic parts are mounted has a coefficient of thermal expansion as high as 15 ppm/° C. or more, a thermal strain is caused upon a thermal impact, which in turn generates a thermal stress.

A substrate having mounted thereon a semiconductor package having a conventional lead frame such as QFP and SOP, has kept reliability by absorbing a thermal stress at a portion of the lead frame.

However, in the bare chip mounting, a method of connecting an electrode of the semiconductor chip to a wiring board pad of the wiring board using a solder ball or a method of connecting by preparing a small projection called bump and using a conductive paste is employed. Therefore, a thermal stress is concentrated on this connecting portion thereby lowering the interconnection reliability. It has been known that introduction of a resin called underfil between the semiconductor element and the wiring board is effective for dispersing the thermal stress. However, the number of steps for mounting is increased, elevating the cost. On the other hand, there is a method of connecting an electrode of the semiconductor element to a wiring pad of the wiring board using conventional wire bonding, however, in this method, the board must be coated with a resin for encapsulation for protecting the wire, thus increasing the number of steps for mounting.

CSP can be mounted together with other electronic parts, and ones having various structures have been proposed as shown in Table 1 appearing at page 5 of "Future of CSP (fine pitch BGA) put into practical use", the article of Surface Mounting Technology, March, 1997, published by Nikkan Kogyo Shimbun Ltd. Especially a method using a tape and a carrier substrate in a wiring board called interposer is being put into practical use. This includes systems shown in the above table that Tessera, Inc. and Texas Instruments Inc. are developing. In these systems, a semiconductor device is mounted through a wiring board called interposer, and hence excellent interconnection reliability is exhibited as reported in Shingaku Technical Report CPM96-121, ICD96-160 (1996-12) "Development of Tape BGA size CSP", and Sharp Technical Journal, No. 66 (1996-12) "Development of Chip Size Package".

Between the semiconductor element of CSP and the wiring board called interposer, an adhesive film is preferably used which lowers the thermal stress caused by the difference in coefficient of thermal expansion between the semiconductor device and the wiring board. In addition, the adhesive film is also required to have moisture resistance and endurance at high temperatures. Further, from the viewpoint of facilitating control of the production process, the adhesive film is desired to be of a film type.

An adhesive of a film type is used in flexible printed circuit boards, and those comprised mainly of an acrylonitrile-butadiene rubber are frequently used.

As printed circuit board materials for improving a moisture resistance, Japanese Provisional Patent Publication No. 243180/1985 discloses an adhesive comprising an acrylic resin, an epoxy resin, polyisocyanate, and an inorganic filler, and Japanese Provisional Patent Publication No. 138680/1986 discloses an adhesive comprising an acrylic resin, an epoxy resin, a compound having a urethane bond in the molecule and having primary amine at both terminals thereof and an inorganic filler.

A number of adhesives of a film type comprised mainly of an acrylonitrile-butadiene rubber are used. However, the adhesives have disadvantages in that the adhesive force is significantly lowered after treated at high temperatures for a long time and that a resistance to electrolytic corrosion is poor. The adhesives suffer marked deterioration especially in the moisture resistance test under severe conditions in, e.g., a pressure cooker test (PCT) treatment, which is used for the reliability evaluation of semiconductor relating parts.

The adhesive disclosed in each of Japanese Provisional Patent Publications No. 243180/1985 and No. 138680/1986 suffers marked deterioration when subjected to moisture resistance test under severe conditions in a PCT treatment.

The above adhesive cannot be used as a printed circuit board relating material in the mounting process of a semiconductor element on a wiring board, because the difference in coefficient of thermal expansion between the semiconductor element, and the wiring board called interposer is large, thereby generating a crack during reflow. In addition, the adhesive cannot be used, since it suffers marked deterioration when subjected to moisture resistance test under severe conditions in the temperature cycle test or PCT treatment.

The present inventors have found that, as described in Japanese Provisional Patent Publication No. 2000-154361, by reducing the elastic modulus of the adhesive film around room temperature, the thermal stress caused in the heating-cooling cycle due to the difference in coefficient of thermal expansion between the semiconductor chip and the wiring board can be lowered, so that no crack is caused during reflow and no damage is observed after temperature cycle test, thus giving the adhesive film excellent in heat resistance.

However, when demands on heat resistance and resistance to reflow crack become severer in future, it is necessary that higher level of heat resistance and moisture resistance be imparted to the adhesive film by increasing the peel strength at high temperatures and elastic modulus at high temperatures. Further, it is necessary to make an amount of volatilization from the adhesive a less level. When the amount of volatilization is at a certain level or higher, peripheral apparatuses are possibly contaminated during the process of operation.

An object of the present invention is to provide an adhesive composition which can form an adhesive film that has enough heat resistance and moisture resistance required for mounting semiconductor elements having a large coefficient of thermal expansion on a substrate for mounting semiconductor, and that can suppress an amount of volatilization at the time of use, a process for producing the same, an adhesive film using the adhesive composition, a substrate for mounting semiconductor, and a semiconductor device.

DISCLOSURE OF THE INVENTION

The adhesive composition of the present invention is characterized in that it comprises (a) an epoxy resin, (b) a curing agent, and (c) a polymer compound incompatible with the epoxy resin, and further comprises (d) a filler and/or (e) a curing accelerator, as necessary.

In addition, the adhesive composition of the present invention is characterized in that it is separated into two phases after being cured as viewed in the cross-section thereof.

Further, the adhesive composition of the present invention is characterized in that it gives a cured product having a storage elastic modulus at 240° C. of 1 to 20 MPa.

Further, the adhesive composition of the present invention is characterized in that it has pores having an average diameter of 0.01 μm to 2 μm after being cured, wherein the volume percentage of the pores in the composition cured is 0.1 to 20% by volume.

The process for producing an adhesive composition of the present invention is characterized in that it comprises mixing (a) an epoxy resin with (b) a curing agent and (d) a filler, and then, mixing the resultant mixture with (c) a polymer compound incompatible with the epoxy resin.

The adhesive film of the present invention is characterized in that it is obtained by forming the above adhesive composition into a film.

The adhesive film of the present invention is characterized in that it comprises a laminated cured product of an adhesive composition and a polyimide film, wherein, when the laminated cured product is subjected to moisture absorption treatment followed by heat treatment at 260° C. for 120 seconds, the resultant laminated cured product does not suffer peeling with a diameter of 2 mm or more.

In addition, the adhesive film of the present invention is characterized in that it has pores having an average diameter of 0.01 μm to 2 μm after being cured, wherein the volume percentage of the pores in the adhesive film is 0.1 to 20% by volume.

Further, the adhesive film of the present invention is characterized in that it is separated into two phases after being cured as viewed in the cross-section thereof.

Further, the adhesive film of the present invention is characterized in that it exhibits lowering in flow amount after 72 hours at 60° C. of 50% or less.

The adhesive film having a support of the present invention is characterized in that it comprises the above adhesive film(s) laminated directly or mediated by another layer, on one surface or both surfaces of the support layer.

Further, the adhesive film having a support of the present invention is characterized in that it further comprises, on one surface or both surfaces thereof, a layer or layers for protecting the adhesive layer.

The substrate for mounting semiconductor of the present invention is characterized in that it comprises a wiring board and the above adhesive film disposed on a chip-mounting surface thereof.

The semiconductor device of the present invention is characterized in that it uses the above adhesive film or substrate for mounting semiconductor.

BEST MODE FOR CARRYING OUT THE INVENTION

Figure 1:
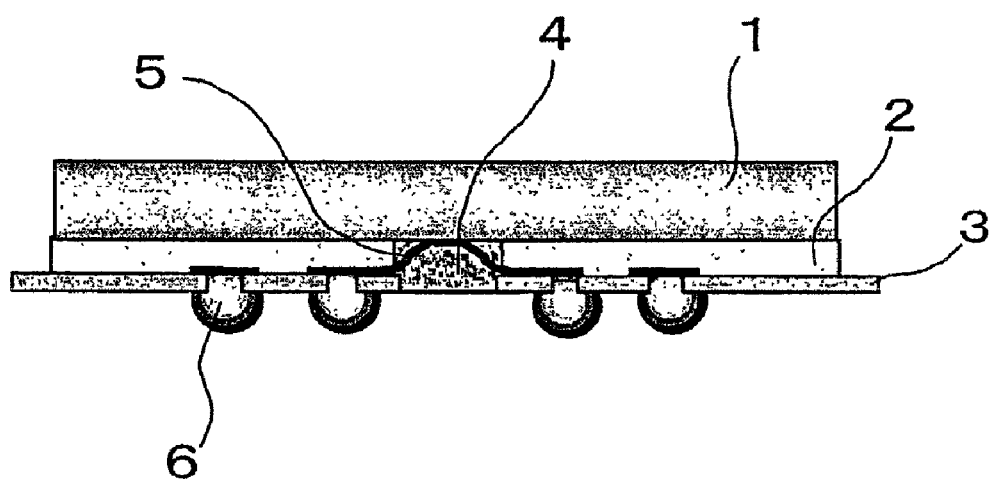
FIG. 1 is a view showing a semiconductor device of the present invention. In the drawing, reference numeral 1 denotes a semiconductor chip, 2 denotes an adhesive film, 3 denotes a wiring board, 4 denotes an encapsulating material, 5 denotes a beam lead, and 6 denotes a solder ball.

Hereinbelow, the present invention will be described in more detail.

(a) The epoxy resin to be used in the present invention is not particularly limited as long as it is cured to exhibit an adhesive action. An epoxy resin having two or more functional groups and preferably having a molecular weight of less than 5,000, more preferably less than 3,000 can be used. For example, bifunctional epoxy resins such as a bisphenol A type epoxy resin and a bisphenol F type epoxy resin, and novolak epoxy resins such as a phenolic novolak type epoxy resin and a cresol novolak type epoxy resin, can be used. In addition, generally known polyfunctional epoxy resins and heterocycle-containing epoxy resins can be used.

As these epoxy resins which are commercially available, for example, bisphenol A type epoxy resins such as EPIKOTE 807, EPIKOTE 815, EPIKOTE 825, EPIKOTE 827, EPIKOTE 828, EPIKOTE 834, EPIKOTE 1001, EPIKOTE 1002, EPIKOTE 1003, EPIKOTE 1055, EPIKOTE 1004, EPIKOTE 1004AF, EPIKOTE 1007, EPIKOTE 1009, EPIKOTE 1003F and EPIKOTE 1004F (manufactured by Japan Epoxy Resins Co., Ltd., trade name), DER-330, DER-301, DER-361, DER-661, DER-662, DER-663U, DER-664, DER-664U, DER-667, DER-642U, DER-672U, DER-673MF, DER-668 and DER-669 (they are manufactured by Dow Chemical Company, trade name), YD8125 and YDF8170 (manufactured by Tohto Kasei Co., Ltd., trade name); bisphenol F type epoxy resins such as YDF-2004 (manufactured by Tohto Kasei Co., Ltd., trade name); phenolic novolak type epoxy resins such as EPIKOTE 152 and EPIKOTE 154 (manufactured by Japan Epoxy Resins Co., Ltd., trade name), EPPN-201 (manufactured by Nippon Kayaku Co., Ltd., trade name) and DEN-438 (manufactured by Dow Chemical Company, trade name); cresol novolak type epoxy resins such as EPIKOTE 180S65 (manufactured by Japan Epoxy Resins Co., Ltd., trade name), Araldite ECN1273, Araldite ECN1280 and Araldite ECN1299 (manufactured by Ciba Specialty Chemicals Inc., trade name), YDCN-701, YDCN-702, YDCN-703 and YDCN-704 (manufactured by Tohto Kasei Co., Ltd., trade name), EOCN-102S, EOCN-103S, EOCN-104S, EOCN-1012, EOCN-1020, EOCN-1025 and EOCN-1027 (manufactured by Nippon Kayaku Co., Ltd., trade name), ESCN-195x, ESCN-200L and ESCN-220 (manufactured by Sumitomo Chemical CO., Ltd., trade name); polyfunctional epoxy resins such as EPON 1031S, EPIKOTE 1032H60 and EPIKOTE 157S70 (manufactured by Japan Epoxy Resins Co., Ltd., trade name), Araldite 0163 (manufactured by Ciba Specialty Chemicals Inc., trade name), Denacol EX-611, Denacol EX-614, Denacol EX-614B, Denacol EX-622, Denacol EX-512, Denacol EX-521, Denacol EX-421, Denacol EX-411 and Denacol EX-321 (manufactured by Nagase Chemicals Ltd., trade name), EPPN501H and EPPN502H (manufactured by Nippon Kayaku Co., Ltd., trade name); amine type epoxy resins such as EPIKOTE 604 (manufactured by Japan Epoxy Resins Co., Ltd., trade name), YH-434 (manufactured by Tohto Kasei Co., Ltd., trade name), TETRAD-X and TETRAD-C (manufactured by Mitsubishi Gas Chemical Company, Inc., trade name) and ELM-120 (manufactured by Sumitomo Chemical Co., Ltd., trade name); heterocycle-containing epoxy resins such as Araldite PT810 (manufactured by Ciba Specialty Chemicals Inc., trade name); and alicyclic epoxy resins such as ERL4234, ERL4299, ERL4221 and ERL4206 (manufactured by Union Carbide Corporation, trade name) can be used, and one kind or two or more kinds of them can be also used in combination.

In the present invention, in terms of heat resistance, an epoxy resin being in a solid state at room temperature and having a softening point of 50° C. or more as measured by a ring and ball method is preferably used in an amount of 20% by weight or more, more preferably 40% by weight or more, further preferably 60% by weight or more, based on the total weight of the epoxy resins used. Examples of such epoxy resins include a bisphenol A type epoxy resin, a bisphenol F type epoxy resin, a bisphenol S type epoxy resin, an alicyclic type epoxy resin, an aliphatic linear epoxy resin, a phenolic novolak type epoxy resin, a cresol novolak type epoxy resin, a bisphenol A novolak type epoxy resin, diglycidyl ether compounds of a biphenol, diglycidyl ether compounds of a naphthalenediol, diglycidyl ether compounds of a phenol, diglycidyl ether compounds of an alcohol, and alkyl-substituted compounds, halides, and hydrogenation products thereof. These may be used in combination, and may contain an ingredient other than the epoxy resins as an impurity.

It is preferred to use an epoxy resin having a large molecular weight and having a softening point of 50° C. or more and a rubber in combination wherein the difference in polarity between the epoxy resin and the rubber is large since these are difficulty compatible to each other.

It is necessary that the epoxy resin be incompatible with the polymer compound, however, when two or more epoxy resins are used in combination as the epoxy resin, if the mixture of the epoxy resins is incompatible with the polymer compound, each of the epoxy resins is not necessarily incompatible with the polymer compound. For example, when epoxy resin YDCN703, which is solely incompatible with the polymer compound and which has a softening point of 50° C. or more, and epoxy resin EPIKOTE 828, which is compatible by itself with the polymer compound and which has a softening point of less than 50° C., are used in combination, a mixture of these epoxy resins in a weight ratio of 1:0 to 1:10 is incompatible with the polymer compound.

(b) The curing agent to be used in the present invention is not particularly limited as long as it can cure an epoxy resin. Examples of such curing agents include polyfunctional phenols, amines, imidazole compounds, acid anhydrides, organophosphorus compounds, and halides thereof, polyamide, polysulfide, and boron trifluoride.

Examples of polyfunctional phenols include monocyclic bifunctional phenols such as hydroquinone, resorcinol, and catechol; polycyclic bifunctional phenols such as bisphenol A, bisphenol F, bisphenol S, a naphthalenediol, and a biphenol; and halides and alkyl-substituted compounds thereof. Further, examples include phenolic resins which are polycondensation products of the above phenols and aldehydes such as a phenolic novolak resin, a resol resin, a bisphenol A novolak resin, and a cresol novolak resin.

Examples of preferable phenolic resin curing agents that are commercially available include, for example, PHENOLITE LF2882, PHENOLITE LF2822, PHENOLITE TD-2090, PHENOLITE TD-2149, PHENOLITE VH4150, and PHENOLITE VH4170, (manufactured by Dainippon Ink & Chemicals, Inc., trade names).

In the present invention, it is preferred to use a phenolic resin having a hydroxyl equivalent of 150 g/eq or more. The above phenolic resin is not particularly limited as long as it has the above-mentioned hydroxyl equivalent value, and novolak type or resol type resins are preferably used because they have excellent electrolytic corrosion resistance when absorbing moisture.

As specific examples of phenolic resins mentioned above, there can be mentioned, for example, phenolic resins represented by the following general formula (I):

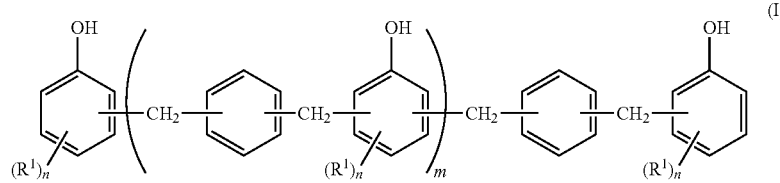

wherein $R^1$ each may be the same or different from each other and represents a hydrogen atom, a straight or branched alkyl group having 1 to 10 carbon atoms, a cyclic alkyl group, an aralkyl group, an alkenyl group, a hydroxyl group, an aryl group or a halogen atom; n represents an integer of 1 to 3; and m represents an integer of 0 to 50.

The phenolic resin is not particularly limited as long as it corresponds to formula (I), and, from the viewpoint of obtaining excellent moisture resistance, it is preferred that the phenolic resin exhibits a water absorption of 2% by weight or less after being placed in a thermo-humidistatic chamber at 85° C. at a relative humidity (RH) of 85% for 48 hours. Further, it is preferred to use a phenolic resin which exhibits a weight loss by heating at 350° C. (temperature elevation rate: 5° C./min; atmosphere: nitrogen gas) of less than 5% by weight as measured by a thermogravimetric analyzer (TGA) because an amount of the volatilized components is suppressed during heating and processing, thereby improving the reliability of various properties such as a heat resistance and a moisture resistance, and contamination of the peripheral apparatuses due to the volatile components during operations including heating and processing can be reduced.

The phenolic resin represented by formula (I) in the present invention can be obtained by, for example, reacting a phenolic compound with a xylylene compound comprised of divalent linking groups in the absence or presence of an acid catalyst.

Examples of the above-mentioned phenolic resins include, for example, Milex XLC-series and Milex XL series (manufactured by Mitsui Chemicals, Inc., trade names).

As formulation amounts when the above-mentioned phenolic resin and the epoxy resin are used in combination, the equivalents ratio of the epoxy equivalent to the hydroxyl equivalent is preferably 0.70:0.30 to 0.30:0.70, more preferably 0.65:0.35 to 0.35:0.65, further preferably 0.60:0.30 to 0.30:0.60, especially preferably 0.55:0.45 to 0.45:0.55. When the ratio falls outside of the above range, the resultant adhesive possibly has poor curing properties.

The phenolic compounds used for production of the phenolic resin of the formula (I) can be exemplified by phenol, o-cresol, m-cresol, p-cresol, o-ethylphenol, p-ethylphenol, o-n-propylphenol, m-n-propylphenol, p-n-propylphenol, o-isopropylphenol, m-isopropylphenol, p-isopropylphenol, o-n-butylphenol, m-n-butylphenol, p-n-butylphenol, o-isobutylphenol, m-isobutylphenol, p-isobutylphenol, octylphenol, nonylphenol, 2,4-xylenol, 2,6-xylenol, 3,5-xylenol, 2,4,6-trimethylphenol, resorcin, catechol, hydroquinone, 4-methoxyphenol, o-phenylphenol, m-phenylphenol, p-phenylphenol, p-cyclohexylphenol, o-allylphenol, p-allylphenol, o-benzylphenol, p-benzylphenol, o-chlorophenol, p-chlorophenol, o-bromophenol, p-bromophenol, o-iodophenol, p-iodophenol, o-fluorophenol, m-fluorophenol, p-fluorophenol, etc. These phenolic compounds may be used singly or by mixing two or more kinds thereof. Phenol, o-cresol, m-cresol, p-cresol, etc. are particularly preferred.

As the xylylene compound which is a divalent linking group to be used for production of the phenolic resin of the formula (I), the following xylylene dihalides, xylylene glycols and their derivatives can be used. That is, there may be mentioned α,α'-dichloro-p-xylene, α,α'-dichloro-m-xylene, α,α'-dichloro-o-xylene, α,α'-dibromo-p-xylene, α,α'-dibromo-m-xylene, α,α'-dibromo-o-xylene, α,α'-diiodo-p-xylene, α,α'-diiodo-m-xylene, α,α'-diiodo-o-xylene, α,α'-dihydroxy-p-xylene, α,α'-dihydroxy-m-xylene, α,α'-dihydroxy-o-xylene, α,α'-dimethoxy-p-xylene, α,α'-dimethoxy-m-xylene, α,α'-dimethoxy-o-xylene, α,α'-diethoxy-p-xylene, α,α'-diethoxy-m-xylene, α,α'-diethoxy-o-xylene, α,α'-di-n-propoxy-p-xylene, α,α'-n-propoxy-m-xylene, α,α'-di-n-propoxy-o-xylene, α,α'-di-isopropoxy-p-xylene, α,α'-diisopropoxy-m-xylene, α,α'-diisopropoxy-o-xylene, α,α'-di-n-butoxy-p-xylene, α,α'-di-n-butoxy-m-xylene, α,α'-di-n-butoxy-o-xylene, α,α'-diisobutoxy-p-xylene, α,α'-diisobutoxy-m-xylene, α,α'-diisobutoxy-o-xylene, α,α'-di-tert-butoxy-p-xylene, α,α'-di-tert-butoxy-m-xylene and α,α'-di-tert-butoxy-o-xylene. These compounds can be used singly or two or more kinds thereof can be used as a mixture. Of these, particularly preferred are α,α'-dichloro-p-xylene, α,α'-dichloro-m-xylene, α,α'-dichloro-o-xylene, α,α'-dihydroxy-p-xylene, α,α'-dihydroxy-m-xylene, α,α'-dihydroxy-o-xylene, α,α'-dimethoxy-p-xylene, α,α'-dimethoxy-m-xylene and α,α'-dimethoxy-o-xylene.

When the above-mentioned phenolic compound and the xylylene compound are to be reacted, the reaction is carried out by using an acid catalyst, e.g., a mineral acid such as hydrochloric acid, sulfuric acid, phosphoric acid, polyphosphoric acid, etc.; an organic carboxylic acid such as dimethyl sulfate, diethyl sulfate, p-toluenesulfonic acid, methanesulfonic acid, ethanesulfonic acid, etc.; a superstrong acid such as trifluoromethanesulfonic acid, etc.; a strong acid ion-exchange resin such as an alkanesulfonic acid ion-exchange resin; a superstrong acid ion-exchange resins such as a perfluoroalkanesulfonic acid ion-exchange resin (trade name: Nafion; manufactured by Du Pont Company); natural or synthetic zeolite; or activated clay (acid clay), etc. so that the xylylene compound as a raw material substantially disappears at 50 to 250° C. and the composition of the reaction product becomes constant. The reaction time varies depending on the raw material and the reaction temperature, and it is generally about 1 to 15 hours, and may be actually determined while tracing the composition of the reaction product by GPC (gel permeation chromatography), etc. When a halogenoxylene derivative such as α,α'-dichloro-p-xylene is exceptionally used, the reaction proceeds in the absence of a catalyst while generating the corresponding hydrogen halide gas. Therefore, in such a case, no acid catalyst is needed. In other cases, the reaction proceeds in the presence of an acid catalyst to generate water or alcohol, correspondingly. With respect to the molar ratio of the phenolic compound and the xylylene compound in the reaction, generally, the phenolic compound is used in an excess amount, and, after completion of the reaction, the unreacted phenolic compound is recovered. In this case, the average molecular weight of the phenolic resin depends on the amount of the phenolic compound used, and the larger the amount of the phenolic compound, the lower the average molecular weight of the phenolic resin obtained. A phenolic resin with the phenolic compound portion being an allylphenol can be obtained by, for example, a method in which a phenolic resin which is not allylated is prepared, and then, allylation is carried out by reacting it with an allyl halide to form an allyl ether, followed by Claisen conversion.

Examples of amines include aliphatic or aromatic primary amines, secondary amines, tertiary amines, quarternary ammonium salts, alicyclic amines, guanidines, urea derivatives, etc.

As an example of these compounds, there may be mentioned by N,N-benzyldimethylamine, 2-(dimethylaminomethyl)phenol, 2,4,6-tris(dimethylaminomethyl)phenol, tetramethylguanidine, triethanolamine, N,N'-dimethylpiperadine, 1,4-diazabicyclo[2.2.2]octane, 1,8-diazabicyclo[5.4.0]-7-undecene, 1,5-diazabicyclo[4.4.0]-5-nonene, hexamethylenetetramine, pyridine, picoline, piperidine, pyrrolidine, dimethylcyclohexylamine, dimethylhexylamine, cyclohexylamine, diisobutylamine, di-n-butylamine, diphenylamine, N-methylaniline, tri-n-propylamine, tri-n-octylamine, tri-n-butylamine, triphenylamine, tetramethylammonium chloride, tetramethylammonium bromide, tetramethylammonium iodide, triethylenetetramine, diaminodiphenylmethane, diaminodiphenyl ether, dicyanediamide, tolylbiguanide, guanylurea, dimethylurea, etc.

Examples of imidazole compound include imidazole, 2-ethylimidazole, 2-ethyl-4-methylimidazole, 2-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-phenyl-4-methylimidazoline, benzimidazole, 1-cyanoethylimidazole, etc.

Examples of anhydrides include phthalic anhydride, hexahydrophthalic anhydride, pyromellitic dianhydride, benzophenonetetracarboxylic dianhydride, etc.

As the organophosphorus compound, there is no particular limitation as long as it is a phosphorus compound having an organic group, and examples include hexamethylphosphoric triamide, tri(dichloropropyl)phosphate, tri(chloropropyl) phosphate, triphenyl phosphite, trimethyl phosphate, phenylphosphonic acid, triphenylphosphine, tri-n-butylphosphine, diphenylphosphine, etc.

These curing agents can be used independently or in combination.

The formulation amount of these curing agents is not particularly limited as long as the curing agent can proceed the curing reaction of the epoxy group, but the curing agent is preferably used in an amount of 0.01 to 5.0 equivalents, especially preferably 0.8 to 1.2 equivalent, based on 1 mol of the epoxy group.

As the epoxy resin and the curing agent, it is preferred to use a compound having no mutagen, for example, a compound using no bisphenol A, since it has less influence on the environment and human bodies.

(c) The polymer compound incompatible with the epoxy resin used in the present invention is not particularly limited as long as it is incompatible with the epoxy resin, and examples include rubbers such as an acrylic copolymer, an acrylic rubber, etc., silicone resins, silicone modified resins such as silicone modified polyamideimide, etc. To be incompatible with the epoxy resin indicates a property of being separated from the epoxy resin into two or more phases. The compatibility of the resins is defined as a visible light (600 nm) transmittance of a film (50 μm) prepared from a varnish containing the epoxy resin and the acrylic copolymer (component ratio=1:1). When the transmittance of the film is 50% or more, the polymer compound is "compatible" with the epoxy resin, whereas, when the transmittance is less than 50%, the polymer compound is "incompatible (is not compatible)" with the epoxy resin. As the polymer compound of the present invention, those having the transmittance of less than 30% are further preferred.

As (c) the polymer compound of the present invention, those having a reactive group (functional group) and having a weight average molecular weight of 100,000 or more are preferred. Examples of the reactive groups in the present invention include a carboxylic acid group, an amino group, a hydroxyl group, an epoxy group, etc. Especially when the monomer having a functional group used in the polymer compound is acrylic acid of a carboxylic acid type, the crosslinking reaction is likely to proceed, so that the adhesive force of the resultant adhesive may be lowered due to gelation in a varnish state or an increase in the degree of cure in a B-stage. Therefore, it is more preferred to use glycidyl acrylate or glycidyl methacrylate having an epoxy group which does not cause the above phenomenon or causes the above phenomenon taking a longer period of time. As (c) the polymer compound in the present invention, it is further preferred to use an epoxy group-containing acrylic copolymer having a weight average molecular weight of 100,000 or more. Component (c) in the present invention can be obtained by conducting a polymerization reaction so that unreacted monomers remain in a polymer compound or by preparing a polymer compound followed by addition of a reactive group-containing monomer thereto.

The weight average molecular weight is a polystyrene conversion value obtained by a gel permeation chromatography (GPC) method using a calibration curve obtained by standard polystyrene.

Examples of acrylic copolymers include, for example, acrylic rubbers which are copolymers of an acrylate or a methacrylate and acrylonitrile. Further, from the viewpoint of obtaining excellent adhesiveness and excellent heat resistance, especially preferred is an acrylic copolymer containing 0.5 to 6% by weight of glycidyl acrylate or glycidyl methacrylate as a functional group and having a glass transition temperature (hereinafter, referred to simply as "Tg") of −50° C. to 30° C., further preferably −10° C. to 30° C., and having a weight average molecular weight of 100,000 or more. As an acrylic copolymer containing 0.5 to 6% by weight of glycidyl acrylate or glycidyl methacrylate and having Tg of −10° C. or more and having a weight average molecular weight of 100,000 or more, there can be mentioned, for example, HTR-860P-3 (manufactured by Teikoku Chemical Industries Co., Ltd., trade name). It is more preferred that the copolymerization ratio for the glycidyl acrylate or glycidyl methacrylate used as a functional group monomer is 2 to 6% by weight. For obtaining a higher adhesive force, the copolymerization ratio is preferably 2% by weight or more, and, when it exceeds 6% by weight, gelation may occur. As the remaining portion, a mixture of an alkyl acrylate or an alkyl methacrylate having an alkyl group of 1 to 8 carbon atoms such as methyl acrylate or methyl methacrylate, and styrene or acrylonitrile can be used. Of these, ethyl(meth)acrylate and/or butyl(meth)acrylate is particularly preferred. It is preferred that the mixing ratio is adjusted considering the Tg of the copolymer. When Tg is less than −10° C., the tackiness of the adhesive layer or adhesive film in a B-stage tends to increase, so that the handling properties may be sometimes poor. The polymerization method is not particularly limited, and examples may include a pearl polymerization and a solution polymerization, and a copolymer is obtained by these methods.

The weight average molecular weight of the epoxy group-containing acrylic copolymer is preferably 300,000 to 3,000,000, more preferably 500,000 to 2,000,000. When the weight average molecular weight is less than 300,000, strength and flexibility of the copolymer in a sheet state or in a film state may be lowered and tackiness thereof may be increased. On the other hand, when it exceeds 3,000,000, the flowability of the copolymer may be low and thus there is a possibility that the circuit filling property for wiring may be lowered.

With respect to the addition amount of (c) the polymer compound incompatible with the epoxy resin, from the viewpoint of reducing the elastic modulus and suppressing the flowability during shaping, it is preferred that the ratio A/B is 0.24 to 1.0, where A represents the total weight of (a) the epoxy resin and (b) the curing agent and B represents the weight of (c) the polymer compound incompatible with the epoxy resin. When the formulation ratio for the polymer compound is less than 0.24, the handling properties at high temperatures tend to be poor. On the other hand, when it exceeds 1.0, the effects of reducing the elastic modulus and suppressing the flowability during shaping tend to be poor.

To the adhesive composition of the present invention, if desired, (d) a filler and/or (e) a curing accelerator can be further added.

Examples of (d) the filler used in the present invention include an inorganic filler and organic filler. From the viewpoint of improving handling properties, improving thermal conductivity, adjusting the melt viscosity and imparting thixotropic properties, etc., it is preferred to add an inorganic filler.

The inorganic filler is not particularly limited, and examples may include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whisker, boron nitride, crystalline silica, amorphous silica, etc. These can be used independently or in combination. From the viewpoint of improving the thermal conductivity, aluminum oxide, aluminum nitride, boron nitride, crystalline silica, amorphous silica, etc. are preferred. From the viewpoint of adjusting the melt viscosity and imparting thixotropic properties, aluminum hydroxide, magnesium hydroxide, calcium carbonate, magnesium carbonate, calcium silicate, magnesium silicate, calcium oxide, magnesium oxide, aluminum oxide, crystalline silica, amorphous silica, etc. are preferred.

Examples of the organic filler include various rubber fillers such as acrylonitrile-butadiene rubber fillers and silicone rubber fillers, etc. These have effects of improving the flexibility at low temperatures and reducing the elastic modulus.

It is more preferred that the filler used in the present invention has a contact angle with water of 100 degrees or less. When the contact angle with water exceeds 100 degrees, the effect attained by addition of the filler is likely to be lowered. The contact angle with water is preferably 60 degrees or less, since the effect of improving a reflow resistance is especially high. It is preferred that the filler has an average particle diameter of 0.005 μm or more to 0.1 μm or less. When the average particle diameter of the filler is less than 0.005 μm, the dispersion property and the flowability tend to be lowered, and, on the other hand, when the average particle diameter exceeds 0.1 μm, the effect of improving the adhesiveness tends to be decreased.

The contact angle of the filler with water can be measured by the following method. A filler is subjected to compression molding to prepare a plane plate, and a water drop is placed on the plate and the angle of the water drop with the plate is measured by means of a contact angle meter. This measurement is repeated 10 times to obtain an average value, and this average value is used as a value of the contact angle.

Examples of such a filler include silica, alumina, antimony oxide and the like. Silica is commercially available from C.I. KASEI CO., LTD. in the trade name of NanoTek $SiO_2$ (contact angle: 43 degrees; average particle diameter: 0.012 μm) or available from Nippon Aerosil Co., Ltd. in the trade name of Aerosil R972 (average particle diameter: 0.016 μm). Alumina is commercially available from C. I. KASEI CO., LTD. in the trade name of NanoTek $Al_2O_3$ (contact angle: 55 degrees; average particle diameter: 0.033 μm). Diantimony trioxide is commercially available from Nihon Mining & Concentrating Co., Ltd. in the trade name of PATOX-U (contact angle: 43 degrees; average particle diameter: 0.02 μm).

It is preferred that the amount of the filler added is 0 part by weight or more to 50 parts by weight or less based on 100 parts by weight of the total weight of the epoxy resin and the curing agent. When the amount of the filler used exceeds 50 parts by weight, problems may arise such that the storage elastic modulus increases and the adhesiveness becomes poor. The amount of the filler used is further preferably 5 parts by weight or more to less than 40 parts by weight, especially preferably 10 parts by weight or more to less than 30 parts by weight.

(e) The curing accelerator to be used in the adhesive composition of the present invention is not particularly limited, and, for example, tertiary amines, imidazoles, quaternary ammonium salts, etc. can be used. Examples of imidazoles include 2-methylimidazole, 2-ethyl-4-methylimidazole, 1-cyanoethyl-2-phenylimidazole, 1-cyanoethyl-2-phenylimidazolium trimellitate, etc., and these can be used independently or in combination. Imidazoles are commercially available from, for example, Shikoku Kasei Kogyo Co. in the trade names of 2E4MZ, 2PZ-CN, and 2PZ-CNS.

From the viewpoint of prolonging the duration of use of the film, it is preferred that the curing accelerator has potentiality. Representative examples thereof include dihydrazide compounds such as dicyandiamide, adipic dihydrazide, etc., guanamine acid, melamine acid, addition products of an epoxy compound and an imidazole compound, addition products of an epoxy compound and a dialkylamine, addition products of an amine and thiourea, addition products of an amine and isocyanate, etc. From the viewpoint of reducing the activity at room temperature, it is preferred that the curing accelerator has an adduct structure.

The formulation amount of (e) the curing accelerator is preferably 0 to 5.0% by weight, more preferably 0.05 to 3.0% by weight, further preferably 0.2 to 3.0% by weight based on the total weight of the epoxy resin and the curing agent. When the formulation amount of the curing accelerator exceeds 5.0% by weight, the storage stability of the resultant composition becomes poor, so that the pot life is likely to be insufficient.

Also, in the present invention, it is preferred that the cured product of the adhesive composition has an elastic modulus in tensile of 1 to 20 MPa as measured at 240° C. When the elastic modulus in tensile exceeds 20 MPa, the stress relaxation property is lowered, increasing a likeliness to generate a bend. On the other hand, when the elastic modulus in tensile is less than 1 MPa, a reflow crack is likely to be caused.

The measurement of an elastic modulus in tensile at 240° C. is conducted as follows. First, an adhesive composition having an initial length of 20 mm (L) and having a thickness of about 50 μm is cured at 170° C. for one hour to prepare a cured film. The cured film is placed in a thermostatic chamber at 240° C. in a state such that a predetermined load of 1 to 10 kg (W) is applied to the cured film. After the temperature of the cured film in the chamber reaches 240° C., an elongation (ΔL) and a cross-sectional area (S) of the cured film are determined to calculate an elastic modulus in tensile (E') according to the following formula:

$$E'=L \cdot W/(\Delta L \cdot S)$$

The adhesive composition of the present invention preferably exhibits a weight loss by heating at 270° C. of 2% by weight or less, more preferably 1.5% by weight, further preferably 1% by weight. When the weight loss by heating is more than the above value, the composition tends to cause contamination of the peripheral apparatuses during the use.

In the adhesive composition of the present invention, for improving the flexibility and the resistance to reflow crack, a high molecular-weight resin compatible with the epoxy resin can be added. The high molecular-weight resin compatible with the epoxy resin is not particularly limited, and, for example, phenoxy resins, high molecular-weight epoxy resins, extra-high molecular-weight epoxy resins, large polarity functional group-containing rubbers, large polarity functional group-containing reactive rubbers, etc. can be used.

Phenoxy resins are commercially available from Tohto Kasei Co., Ltd. in the trade names of Phenotot YP-40 and Phenotot YP-50, and also available from Phenoxy Associates Co. in the trade names of PKHC, PKHH, and PKHJ.

Examples of high molecular-weight epoxy resins include high molecular-weight epoxy resins having a molecular weight of 30,000 to 80,000 and extra-high molecular-weight epoxy resins having a molecular weight exceeding 80,000 (see Japanese Patent Publications Nos. 59617/1995, 59618/1995, 59619/1995, 59620/1995, 64911/1995, 68327/1995, etc.). As the large polarity functional group-containing reactive rubber, a carboxyl group-containing acrylonitrile-butadiene rubber is commercially available from JSR Co. in the trade name of PNR-1.

It is preferred that the amount to be used of the high molecular-weight resin compatible with the epoxy resin is 40 parts by weight or less based on 100 parts by weight of the epoxy resin. When the amount exceeds 40 parts by weight, the Tg of the epoxy resin layer is possibly lowered.

To the adhesive composition of the present invention, various kinds of coupling agents can be further added for improving bonding at the interface between different kinds of materials. Examples of the coupling agents include silane type coupling agents, titanium type coupling agents, and aluminum type coupling agents, and the silane type coupling agents are most preferred.

The silane type coupling agent is not particularly restricted and there may be mentioned, for example, vinyltrichlorosilane, vinyltris(β-methoxyethoxy)silane, vinyltriethoxysilane, vinyltrimethoxysilane, γ-methacryloxypropyltrimethoxysilane, γ-methacryloxypropylmethyldimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-mercaptopropyltriethoxysilane, 3-aminopropylmethyldiethoxysilane, 3-ureidopropyltriethoxysilane, 3-ureidopropyltrimethoxysilane, 3-aminopropyltrimethoxysilane, 3-aminopropyl-tris(2-methoxy-ethoxy-ethoxy)silane, N-methyl-3-aminopropyltrimethoxysilane, triaminopropyl-trimethoxysilane, 3-(4,5-dihydro)imidazol-1-yl-propyltrimethoxysilane, 3-methacryloxypropyl-trimethoxysilane, 3-mercaptopropyl-methyldimethoxysilane, 3-chloropropyl-methyldimethoxysilane, 3-chloropropyl-dimethoxysilane, 3-cyanopropyl-triethoxysilane, hexamethyldisilazane, N,O-bis(trimethylsilyl) acetamide, methyltrimethoxysilane, methyltriethoxysilane, ethyltrichlorosilane, n-propyltrimethoxysilane, isobutyltrimethoxysilane, amyltrichlorosilane, octyltriethoxysilane, phenyltrimethoxysilane, phenyltriethoxysilane, methyltri(methacryloyloxyethoxy)silane, methyltri(glycidyloxy)silane, N-β-(N-vinylbenzylaminoethyl)-γ-aminopropyltrimethoxysilane, octadecyldimethyl[3-(trimethoxysilyl) propyl]ammonium chloride, γ-chloropropylmethyldichlorosilane, γ-chloropropylmethyldimethoxysilane, γ-chloropropylmethyldiethoxysilane, trimethylsilyl isocyanate, dimethylsilyl isocyanate, methylsilyltriisocyanate, vinylsilyl triisocyanate, phenylsilyl triisocyanate, tetraisocyanate silane, ethoxysilane isocyanate, etc. These compounds can be used singly or in combination of two or more kinds thereof.

The titanium type coupling agent is not particularly limited and there may be mentioned, for example, isopropyl-trioctanoyl titanate, isopropyldimethacrylisostearoyl titanate, isopropyltridodecylbenzenesulfonyl titanate, isopropylisostearoyldiacryl titanate, isopropyltri(dioctylphosphate)titanate, isopropyltricumylphenyl titanate, isopropyltris(dioctylpyrophosphate) titanate, isopropyltris(n-aminoethyl) titanate, tetraisopropylbis(dioctylphosphite) titanate, tetraoctylbis(ditridecylphosphite) titanate, tetra(2,2-diallyloxymethyl-1-butyl)bis(ditridecyl)phosphite titanate, dicumylphenyloxyacetate titanate, bis(dioctylpyrophosphate)oxyacetate titanate, tetraisopropyl titanate, tetranormalbutyl titanate, butyl titanate dimer, tetra(2-ethylhexyl)titanate, titanium acetylacetonate, polytitanium acetylacetonate, titanium octylene glycolate, titanium lactate ammonium salt, titanium lactate, titanium lactate ethyl ester, polyhydroxytitanium stearate, tetramethyl orthotitanate, tetraethyl orthotitanate, tetrapropyl orthotitanate, tetraisobutyl orthotitanate, stearyl titanate, cresyl titanate monomer, cresyl titanate polymer, diisopropoxy-bis(2,4-pentadionate) titanium (IV), diisopropyl-bis-triethanolamino titanate, octyleneglycol titanate, tetra-n-butoxy titanium polymer, tri-n-butoxytitanium monostearate polymer, tri-n-butoxytitanium monostearate, etc. These compounds can be used singly or in combination of two or more kinds thereof.

The aluminum type coupling agent is not particularly limited and there may be mentioned, for example, aluminum chelate compounds such as ethylacetoacetate aluminum diisopropylate, aluminum tris(ethylacetoacetate), alkylacetoacetate aluminum diisopropylate, aluminum monoacetylacetatobis(ethylacetoacetate), aluminum tris(acetylacetonate), aluminum-monoisopropoxymonooleoxyethyl acetoacetate, aluminum-di-n-butoxide-mono-ethylacetoacetate, aluminum-di-isopropoxide-mono-ethylacetoacetate, etc., and aluminum alcholates such as aluminum isopropylate, mono-sec-butoxy-aluminum diisopropylate, aluminum-sec-butyrate, aluminum ethylate, etc. These compounds can be used singly or in combination of two or more kinds thereof.

In view of obtaining effects and heat resistance thereof as well as reducing the cost, it is preferred that an amount of the coupling agent to be added is 0 to 10 parts by weight based on 100 parts by weight of the total weight of the resins.

Further, to the adhesive composition of the present invention, for adsorbing an ionic impurity to improve the insulation reliability when absorbing moisture, an ion capturing agent can be added. The ion capturing agent is not particularly limited, and a compound known as a copper damage preventing agent for preventing copper from ionizing and dissolving out, for example, a triazinethiol compound and a bisphenol type reducing agent can be used, and inorganic ion adsorbents such as zirconium type and antimony bismuth type magnesium aluminum compounds can be used.

In view of obtaining an effect aimed at by the addition and excellent heat resistance and reducing the cost, it is preferred that the amount of the ion capturing agent added is 0 to 10 parts by weight based on 100 parts by weight of the adhesive composition.

As mentioned above, each of the adhesive composition and the adhesive film of the present invention comprises a composition comprising (a) an epoxy resin, (b) a curing agent, (c) a polymer compound incompatible with the epoxy resin, and optionally (d) a filler and/or (e) a curing accelerator, wherein the components are separated into two phases after being cured as viewed in the cross-section thereof. The term "two phases" used here indicates that the cured product has an islands-in-sea structure. The "islands-in-sea structure" in the present invention means a uniform structure comprising a continuous phase (referred to as "sea") and a dispersed phase (referred to as "islands") described in, for example, page 16 of "Polymer New Material one point Polymer Alloy", published by KYORITSU SHUPPAN CO., LTD., as viewed in the cross-section of the adhesive composition in a cured state, which is polished and examined under, e.g., a scanning type electron microscope.

In the present invention, each of the adhesive composition and the adhesive film of the present invention wherein the components thereof are separated into two phases after being cured as viewed in the cross-section thereof is achieved by a composition which comprises an epoxy resin, a cyanate resin, a phenolic resin and a curing agent therefor, a polymer compound incompatible with the above resin, for example, an acryl rubber, an acrylonitrile-butadiene rubber, a silicone rubber, polyurethane, polyimide, polyamideimide, and a copolymerized product or a mixture thereof, and optionally a filler and/or a curing accelerator, or its film-state material (an adhesive film).

In the present invention, from the viewpoint of obtaining excellent adhesion between the sea phase and the islands phase and excellent adhesiveness, it is preferred that the two phases comprise a sea phase and an islands phase, wherein, a length of an outer periphery of the islands phase represented by S and an area of a cross-section represented by V, satisfy a relationship represented by the following formula (1):

$$S/\sqrt{V} > 3.6 \qquad (1).$$

Further, from the viewpoint of obtaining further excellent adhesion between the sea phase and the islands phase, it is preferred that, in the above formula (I), the relationship: $S/(V^{1/2}) > 4.0$ is satisfied.

In the present invention, each of the adhesive composition and the adhesive film wherein the two phases comprise a sea phase and an islands phase wherein length S of the outer periphery of the islands phase and cross-sectional area V satisfy the relationship represented by $S/(V^{1/2}) > 3.6$ is achieved, for example, by a composition which comprises an epoxy resin and a curing agent therefor, and a polymer compound incompatible with the above resin, for example, a phenoxy resin, and a filler and a curing accelerator, or its film-state material (an adhesive film). It is especially preferred that the composition or film contains a filler, particularly a filler having an average particle diameter of 0.005 to 0.1 µm. Further, it is preferred that the filler is silica and a surface thereof is coated with an organic substance.

In the present invention, there is provided an adhesive composition which gives a cured product having a storage elastic modulus at 240° C. of 1 to 20 MPa.

The adhesive composition having such properties is achieved by a composition which comprises, for example, an epoxy resin, a cyanate resin, a phenolic resin, and a curing agent therefor, a polymer compound incompatible with the above resin, and a filler and a curing accelerator. It is especially preferred that the composition contains a filler, particularly preferably a filler having an average particle diameter of 0.005 to 0.1 µm.

In the present invention, there is further provided an adhesive composition or its film-state material (an adhesive film) wherein, in a cured state, it has pores having an average diameter of 0.01 µm to 2 µm, and the volume percentage of the pores is 0.1 to 20% by volume.

The adhesive film of the present invention has pores having an average diameter of 0.01 to 2.0 µm, more preferably 0.03 to 0.1 µm.

In the present invention, the pores in the adhesive film mean voids, spaces, or gaps, and the average diameter of the pores means a diameter of a sphere when the volume of the pore is converted to that of sphere.

When the average diameter of the pores is less than 0.01 µm or more than 2.0 µm, the PCT resistance (suppressing the lowering of the adhesive strength) may be poor.

The volume percentage of the pores in the adhesive film is 0.1 to 20% by volume. When the volume percentage is less than 0.1% by volume, the effect aimed at by formation of the pores is poor and the PCT resistance is poor. When the volume percentage exceeds 20% by volume, the reflow resistance and PCT resistance are lowered. It is more preferred that the pores are dispersed uniformly.

The volume percentage of the pores is calculated by the following method.

(1) In a view through a scanning type electron microscope (SEM), a square region, having a side with a length of 100 times the average particle diameter of the filler used and which has 50 pores, is selected.

(2) The area of the square region and the total area of the 50 pores are determined by the following method. A transparent film having a uniform density and an even thickness is placed on the SEM photograph, and all the 50 pores are traced by a pen and the traced portions are cut out.

(3) The predetermined area portion (including the 50 pores portions) is traced by a pen in the same manner as in Item (2) above, and the traced portion is cut out.

(4) The weight of each of the cut out portions obtained in Items (2) and (3) above is measured to determine a (2)/(3) value.

(5) $V = [(2)/(3)]^{3/2}$ is determined.

(6) The sequence of the operations in Items (1) to (5) above is repeated five times, and an average of V values obtained is taken as a volume percentage.

It is especially preferred that each of the adhesive composition and the adhesive film of the present invention comprises a cured product of a composition which comprises (a) an epoxy resin, (b) a curing agent, (c) a polymer compound incompatible with the epoxy resin, and optionally (d) a filler and (e) a curing accelerator, wherein each of them has pores having an average diameter of 0.01 to 2.0 µm, and the volume percentage of the pores in the composition or film cured is 0.1 to 20% by volume.

In addition, in the present invention, there is provided an adhesive film which limits lowering in flow after 72 hours at 60° C. of 50% or less.

When the lowering in flow of the adhesive film is 50% or less, the adhesive film can be advantageously stored at 25° C. or 5° C. for a long term, enabling a long storage. The lowering in flow can be measured according to the following procedure.

First, an adhesive film is punched out into a sample having a size of 1 cm×2 cm and pressed under conditions such that the temperature is 160° C., the pressure is 1 MPa, and the time is 18 seconds. With respect to four samples, lengths of portions squeezed out from the original size are measured at two points per each sample by means of an optical microscope to determine an average length, and this value is taken as a flow amount. From the initial flow amount $F_{(0)}$ and the flow amount $F_{(72)}$ after 72 hours at 60° C., the lowering rate of the flow after 72 hours at 60° C. is determined by the following formula:

$$\text{Lowering rate of flow}(\%) = (F_{(0)} - F_{(72)})/F_{(0)} \times 100$$

Further, the adhesive film of the present invention comprises a cured product of a composition which comprises (a) an epoxy resin, (b) a curing agent, (c) a polymer compound incompatible with the epoxy resin, (d) a filler, and (e) a curing accelerator, and it is preferred that components (a) to (e) satisfy the relationship represented by the following formula:

$$0.75 > a/b$$

wherein a represents a contact angle of (d) the filler with water, and b represents a contact angle with water of a material obtained by coating and drying the composition comprising components (a), (b), (c) and (e).

The adhesive film having the above-mentioned properties can be achieved by a composition which comprises, for example, an epoxy resin, a cyanate resin, a phenolic resin, a curing agent therefor, a polymer compound incompatible with the above resin, for example, an acryl rubber, an acrylonitrile-butadiene rubber, a silicone rubber, polyurethane, polyimide, polyamideimide, and a copolymerized product or a mixture thereof, and optionally a filler and/or a curing accelerator, or its film-state material. Especially, the adhesive film is achieved by an adhesive film which comprises an epoxy resin and a curing agent therefor, an epoxy group-containing acrylic copolymer being incompatible with these and containing 1.5 to 2.0% by weight of glycidyl acrylate or glycidyl methacrylate and having a weight average molecular weight of 100,000 or more, and a filler and a curing accelerator. It is especially preferred to use an epoxy resin having a softening point of 50° C. or more. Further, it is preferred to use the Phenolic resin represented by the general formula (I) as a curing agent.

It is preferred that the adhesive film of the present invention is obtained by coating and drying the adhesive composition comprising the above-mentioned components (a) to (e), wherein the components of the above-mentioned (a) to (e) are selected so that the relationship: 0.75>a/b (wherein each of a and b is as defined above) is satisfied.

It is preferred that the relationship: 0.75>a/b is satisfied, that is, a/b is preferably less than 0.75, more preferably less than 0.66, especially preferably less than 0.50. The lower limit of a/b is about 0.25.

When a/b is 0.75 or more, the adhesiveness after absorbing moisture may be poor.

The contact angle a of the filler with water is measured by the above-mentioned method. With respect to the material obtained by applying the composition comprising the components (a), (b), (c) and (e) and drying the composition applied, the contact angle b with water is measured in the same manner as in contact angle a.

Further, it is preferred that each of the adhesive composition and the adhesive film of the present invention comprises the components (a) to (e) in the following formulation ratios: 49.5 to 17.0% by weight of the sum of (a) the epoxy resin and (b) the curing agent;
50.0 to 70.0% by weight of (c) the polymer compound;
0.45 to 10.0% by weight of (d) the filler; and
0.05 to 3.0% by weight of (e) the curing accelerator.

It is preferred that the amount of the sum of (a) the epoxy resin and (b) the curing agent is 17.0 to 49.5% by weight. When the amount is less than 17.0% by weight, the adhesiveness, the moldability (flowability), etc. tend to be insufficient. On the other hand, when the amount exceeds 49.5% by weight, the elastic modulus tends to be too large.

It is preferred that a ratio of (a) the epoxy resin to (b) the curing agent [(a):(b) ratio] is 33:67 to 75:25. When the ratio of the epoxy resin (a) is too large in the above ratio, the heat resistance and moldability (flowability) tend to be unsatisfactory. When the ratio of (b) the curing agent is too large in the above ratio, the moldability (flowability) tends to be insufficient.

By using the composition having the above-mentioned formulation, an adhesive film excellent in heat resistance after absorbing moisture, reflow resistance, adhesiveness after absorbing moisture, etc. can be obtained.

It is preferred that the adhesive film of the present invention comprises the adhesive composition wherein the A/B ratio is 0.24 to 1.0, where A represents the total weight of (a) the epoxy resin and (b) the phenolic resin represented by the above formula (I) and B represents the weight of (c) the acrylic copolymer containing 0.5 to 6% by weight of a reactive group-containing monomer and having a weight average molecular weight of 100,000 or more.

In the present invention, there is provided an adhesive film which comprises a laminated cured product of the above adhesive composition and a polyimide film, wherein the laminated cured product has a peel strength of 50 N/m or more as measured at 240° C. In addition, in the present invention, there is provided the adhesive film wherein, when the laminated cured product is subjected to moisture absorption treatment and then subjected to heat treatment at 260° C. for 120 seconds, the resultant laminated cured product does not suffer peeling with a diameter of 2 mm or more. Further, in the present invention, there is provided a semiconductor device wherein, when the device is subjected to moisture absorption treatment at 85° C. and a relative humidity of 85% for 168 hours, and then, passed through a reflow furnace at 260° C. for 120 seconds, the resultant device does not suffer peeling with a diameter of 1 mm or more between the adhesive layer and the semiconductor chip.

Each of the above-mentioned adhesive film and the semiconductor device can be achieved by a composition which comprises, for example, an epoxy resin, a cyanate resin, a phenolic resin and a curing agent therefor, a polymer compound being incompatible with these and having a crosslinkable functional group, and optionally a filler and/or a curing accelerator, and its film-state material and a semiconductor device produced by using these. Especially, it can be achieved by an adhesive film which comprises an epoxy resin, a curing agent therefor, an epoxy group-containing acrylic copolymer being incompatible with these and containing 1.5 to 6.0% by weight of glycidyl acrylate or glycidyl methacrylate and having a weight average molecular weight of 100,000 or more, and a filler and a curing accelerator. It is especially preferred to use an epoxy resin having a softening point of 50° C. or more. Further, it is preferred that the curing agent is a phenolic resin represented by the above general formula (I). It is especially preferred to contain a filler having an average particle diameter of 0.005 to 0.1 μm. In addition, it is preferred that the filler is silica and has a surface coated with an organic substance.

In the adhesive composition of the present invention, excellent moisture absorption resistance can be obtained by using the low moisture absorption phenolic resin represented by the formula (I), excellent reflow crack resistance can be obtained by using an acrylic copolymer which contains a reactive group-containing monomer to form a suitable crosslinked structure, and excellent reflow crack resistance and heat resistance can be obtained by using an acrylic copolymer incompatible with the epoxy resin to form a definite islands-in-sea structure after being cured. Further, by adding an inorganic filler, there can be obtained an adhesive composition having high elastic modulus at high temperatures, an increased peel strength at high temperatures, and excellent reflow crack resistance by an action of reflow crack prevention.

The adhesive film of the present invention is obtained as an adhesive layer formed on a support film by a method in which the adhesive composition of the present invention is dissolved or dispersed in a solvent such as methyl ethyl ketone, toluene, cyclohexanone, etc. to prepare a varnish, and the prepared varnish is coated to a support film such as a polytetrafluoroethylene film or a polyethylene terephthalate film having a release-treated surface, and then heated and dried to remove the solvent.

In this case, preferred conditions for heating are, for example, such that the temperature is 80 to 250° C. and the time is about 10 minutes to about 20 hours.

As the support film, a plastic film such as a polytetrafluoroethylene film, a polyethylene terephthalate film, a polyethylene film, a polypropylene film, a polymethylpentene film, a polyimide film, etc. can be used, and the surfaces of these plastic films can be release-treated.

The support film can be peeled off upon use so that the adhesive layer (i.e., an adhesive film) can be used solely, or it can be used with the support film and the support film can be peeled off later.

As a method for coating a varnish to a support film, a known method can be used, and examples include a knife coating method, a roll coating method, a spray coating method, a gravure coating method, a bar coating method, a curtain coating method, etc.

The thickness of the adhesive layer (i.e., an adhesive film) is not particularly limited, but the thickness is preferably 3 to 300 μm, more preferably 25 to 250 μm, further preferably 10 to 200 μm, especially preferably 20 to 100 μm. When the thickness is thinner than 3 μm, the stress relaxation effect tends to be poor, and, on the other hand, when the thickness is thicker than 300 μm, such a thickness is disadvantageous from an economical point of view.

The solvent for the varnish is not particularly limited, but, from the viewpoint of facilitating volatilization of the solvent during the film preparation, it is preferred to use a solvent having a relatively low boiling point such as methyl ethyl ketone, acetone, methyl isobutyl ketone, 2-ethoxyethanol, toluene, xylene, butyl cellosolve, methanol, ethanol, 2-methoxyethanol, etc. Further, for the purpose of improving the coating properties, a solvent having a relatively high boiling point such as dimethylacetamide, dimethylformamide, N-methylpyrrolidone, cyclohexanone, etc. may be added.

In preparation of the varnish when a filler is added to the adhesive composition of the present invention, from the viewpoint of dispersibility of the filler, it is preferred to use a mixer, a three-roll mill, a ball mill, a beads mill, etc., and these can be used in combination. Further, the filler and a low molecular compound are preliminarily mixed with each other, and then, a polymer compound is incorporated thereinto, thereby it is possible to shorten the time for mixing. After a varnish is prepared, it is preferred that bubbles in the varnish are removed by vacuum deaeration.

In the present invention, when a filler is added to the adhesive composition, it is preferred to employ a method in which an epoxy resin, a curing agent and a filler are mixed with one another, and then, a polymer compound incompatible with the epoxy resin is mixed into the resultant mixture to produce an adhesive composition. By employing the above production method, a film of the epoxy resin is formed at the interface of the filler. Therefore, after the rubber and the epoxy resin undergo phase separation and are cured, a larger amount of the filler remains in the epoxy resin phase, so that the effect of reinforcing adhesion of the interface between the epoxy resin and the filler is increased, thus improving the heat resistance of the resultant cured product. It is preferred that the ratio of the volume VA of the filler contained in the epoxy resin phase to the volume VB of the filler contained in the rubber component phase after being cured, i.e., VA/VB is 1.2 or more. When VA/VB is less than 1.2, the effect of reinforcing adhesion of the interface between A and B is unsatisfactory, so that the heat resistance of the cured product tends to be poor. VA/VB is especially preferably 2 or more, further preferably 4 or more. Incidentally, VA/VB can be measured in accordance with the following procedure. The rupture cross-section of a film is observed through a scanning type electron microscope to measure a peak of the atoms which constitute the filler by means of an XMA with respect to each of the regions comprised mainly of A and B, respectively. VA/VB is determined from the height ratio between these peaks.

Also, for obtaining a desired thickness of the adhesive layer in the adhesive film of the present invention, two or more films can be laminated to one another. In this case, it is required to set conditions for sticking films so that no peeling occurs in the adhesive layers.

The adhesive film of the present invention can be used in the form of an adhesive member formed on both surfaces of a film as a core material. The adhesive member has an advantage in that the film is improved both in handling properties and punching-out property by a metal mold. It is preferred that the thickness of the core material is in the range of from 5 to 200 μm, but the thickness is not limited to this range.

The film used as a core material is not particularly limited, but the film is preferably a heat-resistant thermoplastic film, further preferably a heat-resistant thermoplastic film having a softening point of 260° C. or higher. When a heat-resistant thermoplastic film having a softening point of lower than 260° C. is used as a core material, the adhesive film is possibly peeled off at high temperatures, i.e., during soldering reflow. Further, heat-resistant thermoplastic films using liquid crystalline polymers, polyamideimide, polyimide, polyetherimide, polyethersulfone, whole aromatic polyester, polytetrafluoroethylene, ethylene-tetrafluoroethylene copolymers, tetrafluoroethylene-hexafluoropropylene copolymers, tetrafluoroethylene-perfluoroalkyl vinyl ether copolymers, etc. are preferably used. Further, as the heat-resistant thermoplastic film, a porous film can be used for reducing the elastic modulus of the adhesive layer.

The adhesive layers formed on both surfaces of the core material can be firstly made a varnish by dissolving or dispersing an adhesive composition in a solvent. The prepared varnish is applied to a heat-resistant thermoplastic film which becomes a core material by coating, and heated to remove the solvent to form an adhesive film on the heat-resistant thermoplastic film. As the method for coating, the above-mentioned methods can be used. This step is conducted with respect to both surfaces of the heat-resistant thermoplastic film to prepare an adhesive film having adhesive layers on both surfaces of the core material. In this case, it is preferred that the surfaces of the adhesive film are protected by cover films so that the adhesive layers on both surfaces do not suffer blocking. However, when no blocking occurs, it is preferred not to use a cover film from an economical point of view, and there is no limitation.

Also, a varnish prepared by dissolving or dispersing an adhesive composition in a solvent, and the prepared varnish is applied to the above-mentioned support film, and heated to remove the solvent to form an adhesive layer on the support material. The adhesive layers are laminated to both surfaces of a core material to prepare an adhesive film having adhesive layers formed on both surfaces of the core material. In this case, the support film can be used as a cover film.

The substrate for mounting semiconductor of the present invention is not limited by substrate materials such as a lead frame having a die pad, ceramic substrates, and organic substrates. As ceramic substrates, alumina substrates and aluminum nitride substrates can be used. As organic substrates, FR-4 substrates obtained by impregnating an epoxy resin into glass cloth, BT substrates obtained by impregnating a bismaleimide-triazine resin into glass cloth, and polyimide film substrates using a polyimide film as a base material can be used.

As the shape of wiring, any structure of single side wiring, both sides wiring, and multilayer wiring may be used, and, if desired, an electrically connected through hole or non-through hole may be formed.

Further, when the wiring appears on the outer surface of the semiconductor device, it is preferred to form a protecting resin layer.

As a method for laminating an adhesive film to a supporting member, a method in which the adhesive film is cut into a desired shape, and the cut adhesive film is heat-pressed to the supporting member at a desired position is general, but the method is not limited to this one.

The semiconductor device in which a semiconductor chip and a wiring board are adhered to each other can be produced by placing an adhesive film between a semiconductor chip and a wiring board so that the first adhesive layer is faced to the surface of the semiconductor chip side, and heat-pressing the resultant laminated material. Also, a semiconductor chip may be placed on the wiring board for mounting semiconductor equipped with the above-mentioned adhesive film and then heat-pressed. The process for producing a semiconductor device in which an adhesive film and a dicing tape are laminated to a semiconductor wafer, and then, the resultant wafer and adhesive film are cut into a chip, and a substrate having a circuit or a film having a circuit and the chip are adhered through an adhesive film is preferred from the viewpoint of omitting the steps of attaching the adhesive films on each of the chip.

As examples of structures of the semiconductor device of the present invention, there can be mentioned a structure such that an electrode of a semiconductor element and a supporting member for the semiconductor are connected to each other through wire bonding, and a structure such that an electrode of a semiconductor element and a supporting member are connected to each other through inner lead bonding of tape automated bonding (TAB), etc., but the structure is not limited to these, and an effect can be obtained by any of these structures.

In the process for producing a semiconductor device in which a semiconductor chip and a substrate having a circuit or a film having a circuit are laminated together with an adhesive film, the conditions for heat press may be such that the temperature, load, and time are selected so that the circuit for wiring board is embedded without a space and satisfactory adhesiveness are exhibited. From the viewpoint of preventing the chip damage, the load is preferably 196 kPa or less, especially preferably 98 kPa or less.

As the semiconductor element, general semiconductor elements such as IC, LSI, VLSI, etc. can be used.

The thermal stress caused between the semiconductor element and the supporting member is significant when the difference in area between the semiconductor element and the supporting member is small, but, in the semiconductor device of the present invention, by using an adhesive film having a low elastic modulus, the thermal stress is relaxed to ensure reliability. These effects are very effectively exhibited when the area of the semiconductor element is 70% or more of the area of the supporting member. Also, in such a semiconductor device in which the difference in area between the semiconductor element and the supporting member is small, external connection terminals are often formed in an area form.

Also, the characteristic feature of the adhesive film of the present invention resides in that an amount of the volatile components from the adhesive layer can be reduced in steps in which the adhesive film is heated such as the step of heat-pressing the adhesive film to the supporting member at a desired position and the step of connecting through wire bonding.

The wiring board used in the wiring board for mounting semiconductor equipped with the adhesive film of the present invention is not limited by materials of the substrate such as ceramic substrates and organic substrates. For example, as ceramic substrates, alumina substrates and aluminum nitride substrates can be used. As organic substrates, FR-4 substrates obtained by impregnating an epoxy resin into glass cloth, BT substrates obtained by impregnating a bismaleimide-triazine resin into glass cloth, and polyimide film substrates using a polyimide film as a base material can be used.

As the shape of wiring, any structures of single side wiring, both sides wiring, and multilayer wiring may be used, and, if desired, an electrically connected through hole or non-through hole may be formed.

Further, when the wiring appears on the outer surface of the semiconductor device, it is preferred to form a protecting resin layer.

As a method for laminating an adhesive film to a wiring board, a method in which the adhesive film is cut into a desired shape, and the cut adhesive film is heat-pressed to the wiring board at a desired position is general, but the method is not limited to this Examples.

EXAMPLES

In the following, the present invention will be explained in more detail by referring to the following Examples, but the present invention is not limited by these.

Example 1

Sample 1

Methyl ethyl ketone was added to Adhesive composition 1 comprising 61 parts by weight of an o-cresol novolak type epoxy resin: YDCN-703 (manufactured by Tohto Kasei Co., Ltd.; trade name; epoxy equivalent: 210), 39 parts by weight of a bisphenol A novolak resin: Plyofen LF2882 (manufactured by Dainippon Ink & Chemicals, Inc.; trade name), 150 parts by weight of an epoxy group-containing acrylic rubber: HTR-860P-3 (manufactured by Teikoku Chemical Industries Co., Ltd.; trade name; molecular weight: 1,000,000; Tg: −7° C.), and, as curing agents, 0.5 part by weight of 1-cyanoethyl-2-phenylimidazole: Curezol 2PZ-CN (manufactured by Shikoku Kasei Kogyo Co.; trade name) and 0.7 part by weight of γ-glycidoxypropyltrimethoxysilane: NUC A-187 (trade name; manufactured by Nippon Unicar Co., Ltd.), was added, and mixed by stirring, followed by vacuum deaeration.

The adhesive varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film (Adhesive film 1) equipped with a support film.

When the adhesive film was stored in an atmosphere at 25° C. at 50% RH (a relative humidity), after one day, the flow amount was 390 μm and the adhesive strength was 620 N/m; after 30 days, the flow amount was 170 μm and the adhesive strength was 550 N/m; and, after 90 days, the flow amount was 35 μm and the adhesive strength was 280 N/m. The flow amount was determined as follows. A film-form adhesive having a thickness of 75 μm was punched out by a 10 mm φ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (UPILEX S (Tg: 500° C. or higher), trade name, manufactured by Ube Industries Ltd. was used) were laminated to both surfaces of the film-form adhesive using a hot roll laminator under conditions at a temperature of 100° C., a pressure of 0.3 MPa and a speed of 0.3 m/min, and then cured at a temperature of 170° C. for one hour. The polyimide films on the both surfaces of the sample cut into 10 mm width were individually supported, and a T-peel strength was measured in an atmosphere at room temperature at a speed of 50 mm/min in the direction of 180 degrees.

Further, a storage elastic modulus of the adhesive composition obtained by curing the adhesive film at 170° C. for one hour was measured by using a dynamic viscoelasticity measuring machine (manufactured by Rheology, DVE-V4) (sample size: length: 20 mm, width: 4 mm, thickness: 80 μm; temperature elevation rate: 5° C./min; tensile mode: 10 Hz; automatic static loading). As a result, it was 380 MPa at 25° C. and 5 MPa at 260° C.

The above-mentioned Adhesive film 1 was allowed to stand for two minutes on a hot platen heated to a predetermined temperature, and the difference in the weight of the film before and after heating was determined to calculate a volatile content according to the following formula:

Volatile content (% by weight)=({[Weight(g) of adhesive film before heating]−[Weight(g) of adhesive film after heating]}/[Weight(g) of adhesive film before heating])×100

The above-mentioned Adhesive films 1 were laminated together using a hot roll laminator under conditions at a temperature of 110° C., a pressure of 0.3 MPa and a speed of 0.3 m/min to prepare an adhesive member having a thickness of 150 μm in a single-layer film form.

By using the obtained adhesive member, a semiconductor chip and a wiring board using a polyimide film having a thickness of 25 μm as a support were laminated together to prepare a semiconductor device sample (having solder balls formed on one surface thereof; Sample 1), and the islands-in-sea structure, heat resistance, flame retardancy, and moisture resistance were examined.

The semiconductor device sample was prepared by the following method. That is, the obtained adhesive film was heat-pressed to a wiring board using a polyimide film having a thickness of 50 μm as a base material, and a semiconductor chip having a size of 15×7 mm was further heat-pressed thereonto, and then, the adhesive film was cured. The end surface of the adhesive film was further partially encapsulated by an encapsulating material (manufactured by Hitachi Chemical Co., Ltd., CEL-C-4100, trade name) to prepare a semiconductor device sample shown in FIG. 1.

With respect to the islands-in-sea structure, the cross-section of the cured product was observed through a scanning type electron microscope to measure a value obtained from the relationship ($S/V^{1/2}$) between length S of the outer periphery of the islands phase and cross-sectional area V. As the evaluation method for heat resistance, an evaluation of reflow crack resistance and a temperature cycle test were used. The evaluation of the reflow crack resistance was made as follows. A sample was placed in an IR reflow furnace in which the temperature was adjusted so that the maximum temperature of the sample surface became 240° C. and this temperature was kept for 20 seconds, and then cooled by allowing the sample to stand at room temperature. The sequence of the above treatments was repeated two times, and then, the resultant sample was observed by visual examination and through an ultrasonic microscope in respect of crack. A sample in which no crack was observed was rated "○", and a sample in which a crack was observed was rated "X". The evaluation of the temperature cycle resistance was made as follows. A sample was allowed to stand in an atmosphere at −55° C. for 30 minutes and then stand in an atmosphere at 125° C. for 30 minutes. The sequence of the above treatments was repeated 1,000 cycles, and then the resultant sample was observed through an ultrasonic microscope in respect of damage such as an occurrence of peeling or crack. A sample in which no damage was observed was rated "○", and a sample in which a damage was observed was rated "X". In addition, the evaluation of the moisture resistance was made as follows. A sample was treated in an atmosphere at a temperature of 121° C. at a humidity of 100% at $2.03 \times 10^5$ Pa (pressure cooker test, POT treatment) for 72 hours, and then the resultant sample was observed in respect of peeling. A sample in which no peeling was recognized in the adhesive member was rated "○", and a sample in which peeling was recognized in the adhesive member was rated "X".

Sample 2

Methyl ethyl ketone was added to Adhesive composition 2 comprising 32.5 parts by weight of a bisphenol A type epoxy resin: EPIKOTE 1001 (manufactured by Japan Epoxy Resins Co., Ltd.; trade name; epoxy equivalent: 475), 35.8 parts by weight of an o-cresol novolak type epoxy resin: YDCN-703 (manufactured by Tohto Kasei Co., Ltd.; trade name; epoxy equivalent: 210), 31.7 parts by weight of a bisphenol A novolak resin: Plyofen LF2882 (manufactured by Dainippon Ink & Chemicals, Inc., trade name), 150 parts by weight of an epoxy group-containing acrylic rubber: HTR-860P-3 (manufactured by Teikoku Chemical Industries Co., Ltd.; trade name; molecular weight: 1,000,000; Tg: −7° C.), and, as curing agents, 0.5 part by weight of 1-cyanoethyl-2-phenylimidazole: Curezol 2PZ-CN (manufactured by Shikoku Kasei Kogyo Corporation, trade name) and 0.7 part by weight of γ-glycidoxypropyltrimethoxysilane: NUC A-187 (manufactured by Nippon Unicar Co., Ltd., trade name), and mixed by stirring, followed by vacuum deaeration.

The adhesive varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film (Adhesive film 2) equipped with a support film.

When the adhesive film was stored in an atmosphere at 25° C. at 50% RH (a relative humidity), after one day, the flow amount was 480 μm and the adhesive strength was 600 N/m; after 30 days, the flow amount was 220 μm and the adhesive strength was 540 N/m; and, after 90 days, the flow amount was 35 μm and the adhesive strength was 260 N/m. The flow amount was determined as follows. A film-form adhesive having a thickness of 75 μm was punched out by a 10 mm φ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (UPILEX S; manufactured by Ube Industries Ltd., trade name) were laminated to both surfaces of the film-form adhesive using a hot roll laminator under conditions at a temperature of 100° C., a pressure of 0.3

MPa and a speed of 0.3 m/min, and then cured at a temperature of 170° C. for one hour. The polyimide films on the both surfaces of the sample cut into 10 mm width were individually supported, and a T-peel strength was measured in an atmosphere at room temperature at a speed of 50 mm/min in the direction of 180 degrees.

Further, a storage elastic modulus of the adhesive composition obtained by curing the adhesive film at 170° C. for one hour was measured by using a dynamic viscoelasticity measuring machine DVE-V4 (manufactured by Rheology, trade name) (sample size: length: 20 mm, width: 4 mm, thickness: 80 μm; temperature elevation rate: 5° C./rain; tensile mode; 10 Hz; automatic static loading). As a result, it was 370 MPa at 25° C. and 5 MPa at 260° C.

Then, substantially the same procedure as in the preparation of Sample 1 was conducted except that Adhesive film 1 was changed to Adhesive film 2 to prepare a semiconductor device sample (Sample 2), and the sample was evaluated in the same manner as in sample 1. The results of evaluation are shown in Table 1.

Sample 3

Methyl ethyl ketone was added to Adhesive composition 3 comprising 45 parts by weight of a bisphenol A type epoxy resin: EPIKOTE 828 (manufactured by Japan Epoxy Resins Co., Ltd.; trade name; epoxy equivalent: 190), 15 parts by weight of an o-cresol novolak type epoxy resin: ESCN195 (manufactured by Sumitomo Chemical Co., Ltd.; trade name; epoxy equivalent: 195), 40 parts by weight of a bisphenol A novolak resin: Plyofen LF2882 (manufactured by Dainippon Ink & Chemicals, Inc., trade name), 150 parts by weight of an epoxy group-containing acrylic rubber: HTR-860P-3 (manufactured by Teikoku Chemical Industries Co., Ltd.; trade name; molecular weight: 1,000,000; Tg: −7° C.), and, as curing agents, 0.5 part by weight of 1-cyanoethyl-2-phenylimidazole: Curezol 2PZ-CN (manufactured by Shikoku Kasei Kogyo Corporation, trade name) and 0.7 part by weight of γ-glycidoxypropyltrimethoxysilane: NUC A-187 (trade name; manufactured by Nippon Unicar Co., Ltd.), and mixed by stirring, followed by vacuum deaeration.

The adhesive varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film (Adhesive film 3) equipped with a support film.

When the adhesive film was stored in an atmosphere at 25° C. at 50% RH (a relative humidity), after one day, the flow amount was 400 μm and the adhesive strength was 600 N/m; after 30 days, the flow amount was 180 μm and the adhesive strength was 500 N/m; and, after 90 days, the flow amount was 30 μm and the adhesive strength was 250 N/m. The flow amount was determined as follows. A film-form adhesive having a thickness of 75 μm was punched out by a 10 mm φ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (UPILEX S; manufactured by Ube Industries Ltd., trade name) were laminated to both surfaces of the film-form adhesive using a hot roll laminator under conditions at a temperature of 100° C., a pressure of 0.3 MPa and a speed of 0.3 m/min, and then cured at a temperature of 170° C. for one hour. The polyimide films on the both surfaces of the sample cut into 10 mm width were individually supported, and a T-peel strength was measured in an atmosphere at room temperature at a speed of 50 mm/min in the direction of 180 degrees.

Further, a storage elastic modulus of the adhesive composition obtained by curing the adhesive film at 170° C. for one hour was measured by using a dynamic viscoelasticity measuring machine DVE-V4 (manufactured by Rheology, trade name) (sample size: length: 20 mm, width: 4 mm, thickness: 80 μm; temperature elevation rate: 5° C./min; tensile mode; 10 Hz; automatic static loading). As a result, it was 360 MPa at 25° C. and 4 MPa at 260° C.

Then, substantially the same procedure as in the preparation of sample 1 was conducted except that Adhesive film 1 was changed to Adhesive film 3 to prepare a semiconductor device sample (Sample 3), and the sample was evaluated in the same manner as in sample 1. The results of evaluation are shown in Table 1.

Sample 4

Methyl ethyl ketone was added to Adhesive composition 4 comprising 45 parts by weight of a bisphenol A type epoxy resin: EPIKOTE 828 (manufactured by Japan Epoxy Resins Co., Ltd.; trade name; epoxy equivalent: 190), 15 parts by weight of an o-cresol novolak type epoxy resin: ESCN195 (manufactured by Sumitomo Chemical Co., Ltd.; trade name; epoxy equivalent: 195), 40 parts by weight of a bisphenol A novolak resin: Plyofen LF2882 (manufactured by Dainippon Ink & Chemicals, Inc., trade name), 150 parts by weight of an acrylic rubber containing no epoxy group: HTR-860-3DR(A) (manufactured by Teikoku Chemical Industries Co., Ltd.; trade name; molecular weight: 1,000,000; Tg: −7° C.), and, as curing agents, 0.5 part by weight of 1-cyanoethyl-2-phenylimidazole: Curezol 2PZ-CN (manufactured by Shikoku Corporation, trade name) and 0.7 part by weight of γ-glycidoxypropyltrimethoxysilane: NUC A-187 (manufactured by Nippon Unicar Co., Ltd., trade name), and mixed by stirring, followed by vacuum deaeration.

The adhesive varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film (Adhesive film 4) equipped with a support film. When the adhesive film was stored in an atmosphere at 25° C. at 50% RH (a relative humidity), after one day, the flow amount was 400 μm and the adhesive strength was 600 N/m; after 30 days, the flow amount was 180 μm and the adhesive strength was 500 N/m; and, after 90 days, the flow amount was 30 μm and the adhesive strength was 250 N/m. The flow amount was determined as follows.

Further, a storage elastic modulus of the adhesive composition obtained by curing the adhesive film at 170° C. for one hour was measured by using a dynamic viscoelasticity measuring machine DVE-V4 (manufactured by Rheology, trade name) (sample size: length: 20 mm, width: 4 mm, thickness: 80 μm; temperature elevation rate: 5° C./min; tensile mode; 10 Hz; automatic static loading). As a result, it was 400 MPa at 25° C. and 1 MPa at 260° C.

Then, substantially the same procedure as in the preparation of sample 1 was conducted except that Adhesive film 1 was changed to Adhesive film 4 to prepare a semiconductor device sample (Sample 4), and the sample was evaluated in the same manner as in sample 1. The results of evaluation are shown in Table 1.

TABLE 1

| Item | | Sample 1 | Sample 2 | Sample 3 | Sample 4 |
|---|---|---|---|---|---|
| Compatibility | | Incompatible | Incompatible | Incompatible | Incompatible |
| Adhesive film | | 1 | 2 | 3 | 4 |
| $S/(V^{1/2})$ | | 3.55 | 3.55 | 3.55 | 3.55 |
| Volatile content (% by weight) | Hot platen: 140° C. | 0 | 0 | 0.55 | 0.48 |
| | Hot platen: 160° C. | 0.02 | 0.05 | 0.64 | 0.59 |
| | Hot platen: 180° C. | 0.07 | 0.09 | 0.90 | 0.84 |
| | Hot platen: 230° C. | 0.30 | 0.42 | 1.34 | 1.29 |
| | Hot platen: 250° C. | 0.52 | 0.56 | 1.85 | 1.77 |
| | Hot platen: 270° C. | 0.80 | 0.90 | 2.60 | 2.51 |
| Heat resistance | Reflow crack resistance | ○ | ○ | ○ | X |
| | Temperature cycle resistance | ○ | ○ | ○ | X |
| Moisture resistance | | ○ | ○ | ○ | ○ |

From Table 1, it is apparent that the adhesive composition of the present invention has a small volatile content and has excellent heat resistance and moisture resistance when being in a B-stage. In addition, it is apparent that more excellent performance can be obtained by using a solid epoxy resin having a softening point of 50° C. or more. Further, it is apparent that, by using a compound containing an epoxy group as a polymer compound, an adhesive member, a substrate for mounting semiconductor, and a semiconductor device each having more excellent heat resistance can be provided.

Example 2

Sample 5

Methyl ethyl ketone was added to a composition comprising 45 parts by weight of EPIKOTE 828 (manufactured by Japan Epoxy Resins Co., Ltd.; trade name, bisphenol A type epoxy resin; epoxy equivalent: 190), 15 parts by weight of ESCN195 (manufactured by Sumitomo Chemical Co., Ltd.; trade name, cresol novolak type epoxy resin; epoxy equivalent: 195), 54.6 parts by weight of Milex XLC-LL (manufactured by Mitsui Chemicals, Inc.; trade name, zylok (phenolic) resin (condensation product of aralkyl ether with phenol); hydroxyl equivalent: 174), 15 parts by weight of Pheienot YP-50 (manufactured by Tohto Kasei Co., Ltd.; trade name, phenoxy resin; molecular weight: 50,000), 150 parts by weight of HTR-860P-3 (manufactured by Teikoku Chemical Industries Co., Ltd.; trade name, epoxy group-containing acrylic rubber; molecular weight: 1,000,000; Tg: −7° C.), 0.5 part by weight of Curezol 2PZ-CN (manufactured by Shikoku Kasei Kogyo Corporation; trade name, 1-cyanoethyl-2-phenylimidazole), and 0.7 part by weight of NUC A-187 (manufactured by Nippon Unicar Co., Ltd.; trade name, γ-glycidoxypropyltrimethoxysilane), and mixed by stirring, followed by vacuum deaeration. The adhesive varnish was coated onto a release-treated polyethylene terephthalate film having a thickness of 75 μm, and dried by heating to 140° C. for 5 minutes to obtain adhesive film (F-1) in a B-stage having a thickness of 75 μm. When the obtained adhesive film was stored in an atmosphere at 25° C. at 50% RH (a relative humidity), after one day, the flow amount was 380 μm and the adhesive strength was 600 N/m; after 30 days, the flow amount was 170 μm and the adhesive strength was 500 N/m; and, after 90 days, the flow amount was 25 μm and the adhesive strength was 250 N/m. The flow amount was determined as follows. A film-form adhesive having a thickness of 75 μm was punched out by a 10 mm ϕ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (manufactured by Ube Industries Ltd., trade name: UPILEX S) were laminated to both surfaces of the film-form adhesive using a hot roll laminator under conditions at a temperature of 100° C., a pressure of 0.3 MPa and a speed of 0.3 m/min, and then cured at a temperature of 170° C. for one hour. The polyimide films (UPILEX) on the both surfaces of the sample cut into 10 mm width were individually supported, and a T-peel strength was measured in an atmosphere at room temperature at a speed of 50 mm/min in the direction of 180 degrees. Further, a storage elastic modulus of the adhesive composition obtained by curing the adhesive film at 170° C. for one hour was measured by using a dynamic viscoelasticity measuring machine (manufactured by Rheology, DVE-V4) (sample size: length: 20 mm, width: 4 mm, thickness: 80 μm; temperature elevation rate: 5° C./min; tensile mode: 10 Hz; automatic static loading). As a result, it was 400 MPa at 25° C. and 8 MPa at 260° C.

In addition, the cross-section of the sample was observed through a scanning type electron microscope. As a result, it was found that a value obtained from the relationship ($S/V^{1/2}$) between length S of the outer periphery of the islands phase and cross-sectional area V is 4.5.

Sample 6

Methyl ethyl ketone was added to a composition comprising 15 parts by weight of YD8125 (manufactured by Tohto Kasei Co., Ltd.; trade name, bisphenol A type epoxy resin; epoxy equivalent: 175), 45 parts by weight of YDCN703 (manufactured by Tohto Kasei Co., Ltd.; trade name, cresol novolak type epoxy resin; epoxy equivalent: 210), 52 parts by weight of Milex XLC-LL (manufactured by Mitsui Chemicals, Inc.; trade name, zylok resin; hydroxyl equivalent: 174), 15 parts by weight of PheienotYP-50 (manufactured by Tohto Kasei Co., Ltd.; trade name, phenoxy resin; molecular weight: 50,000), 150 parts by weight of HTR-860P-3 (manufactured by Teikoku Chemical Industries Co., Ltd.; trade name, epoxy group-containing acrylic rubber; molecular weight: 1,000,000; Tg: −7° C.), 0.5 part by weight of Curezol 2PZ-CN (manufactured by Shikoku Kasei Kogyo Corporation; trade name, 1-cyanoethyl-2-phenylimidazole), and 0.7 part by weight of NUC A-187 (manufactured by Nippon Unicar Co., Ltd.; trade name, γ-glycidoxypropyltrimethoxysilane), and mixed by stirring, followed by vacuum deaeration. The resultant adhesive varnish was coated onto a release-treated polyethylene terephthalate film having a thickness of 75 μm, and dried by heating at 140° C. for 5 minutes to obtain Adhesive film (F-2) in a B-stage having a thickness of 75 μm. When the obtained adhesive film was stored in an atmosphere at 25° C. at 50% RH (a relative humidity), after one day, the flow amount was 400 μm and the adhesive strength was 620 N/m; after 30 days, the flow amount was 180 μm and the adhesive strength was 510 N/m; and, after 90 days, the flow amount was 30 μm and the adhesive strength was 280 N/m. The flow amount was determined as follows. A film-form adhesive having a thickness of 75 μm was punched out by a 10 mm φ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (manufactured by Ube Industries Ltd., trade name: UPILEX S) were laminated to both surfaces of the film-form adhesive using a hot roll laminator under conditions at a temperature of 100° C., a pressure of 0.3 MPa and a speed of 0.3 m/min, and then cured at a temperature of 170° C. for one hour. The polyimide films (UPILEX) on the both surfaces of the sample cut into 10 mm width were individually supported, and a T-peel strength was measured in an atmosphere at room temperature at a speed of 50 mm/min in the direction of 180 degrees. Further, a storage elastic modulus of the adhesive composition obtained by curing the adhesive film at 170° C. for one hour was measured by using a dynamic viscoelasticity measuring machine (manufactured by Rheology, DVE-V4) (sample size: length: 20 mm, width: 4 mm, thickness: 80 μm; temperature elevation rate: 5° C./rain; tensile mode: 10 Hz; automatic static loading). As a result, it was 420 MPa at 25° C. and 10 MPa at 260° C.

Sample 7

Methyl ethyl ketone was added to a composition comprising 15 parts by weight of YD8125 (manufactured by Tohto Kasei Co., Ltd.; trade name, bisphenol A type epoxy resin; epoxy equivalent: 175), 45 parts by weight of YDCN703 (manufactured by Tohto Kasei Co., Ltd.; trade name, cresol novolak type epoxy resin; epoxy equivalent: 210), 50 parts by weight of Milex XLC-4L (manufactured by Mitsui Chemicals, Inc.; trade name, zylok phenolic resin (condensation product of aralkyl ether with phenol); hydroxyl equivalent: 169), 15 parts by weight of Pheienot YP-50 (manufactured by Tohto Kasei Co., Ltd.; trade name, phenoxy resin; molecular weight: 50,000), 150 parts by weight of HTR-860P-3 (manufactured by Teikoku Chemical Industries Co., Ltd.; trade name, epoxy group-containing acrylic rubber; molecular weight: 1,000,000; Tg: −7° C.), 0.5 part by weight of Curezol 2PZ-CN (trade name, manufactured by Shikoku Kasei Kogyo Corporation; 1-cyanoethyl-2-phenylimidazole), and 0.7 part by weight of NUC A-187 (trade name, manufactured by Nippon Unicar Co., Ltd.; γ-glycidoxypropyltrimethoxysilane), and mixed by stirring, followed by vacuum deaeration. The adhesive varnish was coated onto a release-treated polyethylene terephthalate film having a thickness of 75 μm, and dried by heating at 140° C. for 5 minutes to obtain Adhesive film (F-3) in a B-stage having a thickness of 75 μm. When the obtained adhesive film was stored in an atmosphere at 25° C. at 50% RH (a relative humidity), after one day, the flow amount was 3,700 μm and the adhesive strength was 580 N/m; after 30 days, the flow amount was 150 μm and the adhesive strength was 480 N/m; and, after 90 days, the flow amount was 23 μm and the adhesive strength was 250 N/m. The flow amount was determined as follows. A film-form adhesive having a thickness of 75 μm was punched out by a 10 mm φ punch, and placed at a center portion between two sheets of polyethylene terephthalate films cut to 25 mm×25 mm, and pressed under conditions at 100° C. and 3 MPa for 5 minutes, and then, the size of the resultant sample was measured to determine the difference in the radius of the sample before and after pressing. Also, the peel strength was determined as follows. 50 μm polyimide films (manufactured by Ube Industries Ltd., trade name: UPILEX S) were laminated to both surfaces of the film-form adhesive using a hot roll laminator under conditions at a temperature of 100° C., a pressure of 0.3 MPa and a speed of 0.3 m/min, and then cured at a temperature of 170° C. for one hour. The polyimide films (UPILEX) on the both surfaces of the sample cut into 10 mm width were individually supported, and a T-peel strength was measured in an atmosphere at room temperature at a speed of 50 ram/min in the direction of 180 degrees. Further, a storage elastic modulus of the adhesive composition obtained by curing the adhesive film at 170° C. for one hour was measured by using a dynamic viscoelasticity measuring machine (manufactured by Rheology, DVE-V4) (sample size: length: 20 mm, width: 4 mm, thickness: 80 μm; temperature elevation rate: 5° C./min; tensile mode: 10 Hz; automatic static loading). As a result, it was 360 MPa at 25° C. and 7 MPa at 260° C.

Sample 8

Substantially the same procedure as in the preparation of Sample 5 was conducted except that, instead of 54.6 parts by weight of Milex XLC-LL, 37 parts by weight of Plyofen LF2882 (manufactured by Dainippon Ink & Chemicals, Inc.; trade name, bisphenol A novolak resin; hydroxyl equivalent: 118) was used to obtain Adhesive film (F-4) in a B-stage having a thickness of 75 μm. Properties of the adhesive film were evaluated under the same conditions as those in Example 1. As a result, it was found that, after one day, the flow amount was 380 μm and the adhesive strength was 600 N/m; after 30 days, the flow amount was 180 μm and the adhesive strength was 500 N/m; and, after 90 days, the flow amount was 30 μm and the adhesive strength was 250 N/m. Further, a storage elastic modulus of the cured product of the adhesive was 360 MPa at 25° C. and 4 MPa at 260° C.

Sample 9

Substantially the same procedure as in the preparation of Sample 6 was conducted except that, instead of 52 parts by weight of Milex XLC-LL, 35 parts by weight of Plyofen LF2882 (manufactured by Dainippon Ink & Chemicals, Inc.; trade name, bisphenol A novolak resin; hydroxyl equivalent: 118) was used to obtain Adhesive film (F-5) in a B-stage having a thickness of 75 μm. With respect to the obtained adhesive film, properties were evaluated under the same conditions as those in Example 1. As a result, it was found that, after one day, the flow amount was 500 μm and the adhesive strength was 750 N/m; after 30 days, the flow amount was 250 μm and the adhesive strength was 600 N/m; and, after 90 days, the flow amount was 40 μm and the adhesive strength was 450 N/m. Further, a storage elastic modulus of the cured product of the adhesive was 350 MPa at 25° C. and 4 MPa at 260° C.

Sample 10

Substantially the same procedure as in the preparation of Sample 5 was conducted except that, instead of the epoxy group-containing acrylic rubber, HTR-860P-3, manufactured by Teikoku Chemical Industries Co., Ltd., an acrylic rubber containing no epoxy group (molecular weight: 1,000,000) and having a composition such that glycidyl methacrylate is removed from HTR-860P-3 was used to obtain Adhesive film (F-6) in a B-stage having a thickness of 75 μm. Properties of the adhesive film were evaluated under the same conditions as those in Example 1. As a result, it was found that, after one day, the flow amount was 400 μm and the adhesive strength was 600 N/m; after 30 days, the flow amount was 180 μm and the adhesive strength was 500 N/m; and, after 90 days, the flow amount was 30 μm and the adhesive strength was 250 N/m. Further, a storage elastic modulus of the cured product of the adhesive was 400 MPa at 25° C. and 1 MPa at 260° C.

Adhesive films (F-1) to (F-6) in a B-stage obtained in the preparations of Samples 5 to 10 were individually allowed to stand for 2 minutes on a hot platen heated to a predetermined temperature, and the difference in the weight of the film between before and after heating was determined to calculate a volatile content according to the formula shown in Example 1. The results are shown in Table 2.

was made as follows. A sample was allowed to stand in an atmosphere at −55° C. for 30 minutes and then stand in an atmosphere at 125° C. for 30 minutes. The sequence of the above treatments was repeated 1,000 cycles, and then the resultant sample was observed through an ultrasonic microscope in respect of damage such as an occurrence of peeling or crack. A sample in which no damage was observed was rated "○", and a sample in which a damage was observed was rated "X". In addition, the evaluation of the moisture resistance was made as follows. A sample was treated in an atmosphere at a temperature of 121° C. at a humidity of 100% at $2.03 \times 10^5$ Pa (pressure cooker test, PCT treatment) for 72 hours, and then the resultant sample was observed in respect of peeling. A sample in which no peeling was recognized in the adhesive member was rated "○", and a sample in which peeling was recognized in the adhesive member was rated "X". The results are shown in Table 3.

TABLE 2

| Item | | Sample 5 | Sample 6 | Sample 7 | Sample 8 | Sample 9 | Sample 10 |
|---|---|---|---|---|---|---|---|
| Compatibility | | Incompatible | Incompatible | Incompatible | Incompatible | Incompatible | Incompatible |
| Adhesive film | | F-1 | F-2 | F-3 | F-4 | F-5 | F-6 |
| Volatile content (% by weight) | Hot platen: 140° C. | 0 | 0 | 0 | 0.55 | 0.48 | 0 |
| | Hot platen: 160° C. | 0 | 0 | 0 | 0.64 | 0.59 | 0 |
| | Hot platen: 180° C. | 0.01 | 0 | 0 | 0.90 | 0.84 | 0.08 |
| | Hot platen: 230° C. | 0.05 | 0.01 | 0.02 | 1.34 | 1.29 | 0.09 |
| | Hot platen: 140° C. | 0 | 0 | 0 | 0.55 | 0.48 | 0 |
| | Hot platen: 160° C. | 0 | 0 | 0 | 0.64 | 0.59 | 0 |

Also, Adhesive films (F-1) to (F-6) in a B-stage obtained in the preparations of Samples 5 to 10 were individually laminated using a hot roll laminator under conditions at a temperature of 110° C., a pressure of 0.3 MPa and a speed of 0.3 m/min to prepare adhesive members each having a thickness of 150 μm in a single-layer film form.

By using the obtained adhesive member, a semiconductor chip and a wiring board using a polyimide film having a thickness of 25 μm as a base material were laminated together to prepare a semiconductor device sample (having solder balls formed on one surface thereof), and the heat resistance, flame retardancy and moisture resistance were examined. As the evaluation method for heat resistance, an evaluation of reflow crack resistance and a temperature cycle test were used. The evaluation of the reflow crack resistance was made as follows. A sample was subjected to moisture absorption under predetermined conditions (85° C./85%/168 hours), and placed in an IR reflow furnace in which the temperature was adjusted so that the maximum temperature of the sample surface became 240° C. and this temperature was kept for 20 seconds, and then cooled by allowing the sample to stand at room temperature. The sequence of above treatments was repeated three times, and then the resultant sample was observed through an ultrasonic microscope in respect of crack and peeling between the different materials. A sample in which no crack or peeling was observed was rated "○", and a sample in which a crack or peeling was observed was rated "X". The evaluation of the temperature cycle resistance

TABLE 3

| Item | | Sample 5 | Sample 6 | Sample 7 | Sample 8 | Sample 9 | Sample 10 |
|---|---|---|---|---|---|---|---|
| Adhesive film | | F-1 | F-2 | F-3 | F-4 | F-5 | F-6 |
| Heat resistance | Reflow crack resistance | ○ | ○ | ○ | ○ | ○ | X |
| | Temperature cycle resistance | ○ | ○ | ○ | ○ | ○ | X |
| | Humidity resistance | ○ | ○ | ○ | ○ | ○ | ○ |

As can be clearly seen from the results in Table 2 and Table 3, it can be understood that an adhesive member which can further suppress the volatile content during the use can be formed by using a phenolic resin having a hydroxyl equivalent of 150 g/eq or more as a curing agent. Also, it can be understood that an adhesive member, a substrate for mounting semiconductor, and a semiconductor device each having more excellent heat resistance can be provided by using a compound containing an epoxy group as a polymer compound.

Example 3

Sample 11

Cyclohexane was added to a composition comprising 55 parts by weight of YDCN-703 (manufactured by Tohto Kasei Co., Ltd.; trade name, cresol novolak type epoxy resin; epoxy equivalent: 210) as an epoxy resin, 45 parts by weight of Milex XLC-LL (manufactured by Mitsui Chemicals, Inc.; trade name, phenolic resin; hydroxyl equivalent: 175; water absorption: 1.8%; weight loss by heating at 350° C.: 4%) as a phenolic resin, 1.7 part by weight of NUC A-189 (manufactured by Nippon Unicar Co., Ltd.; trade name, γ-mercaptopropyltrimethoxysilane) and 3.2 parts by weight of NUC A-1160 (manufactured by Nippon Unicar Co., Ltd.; trade name, γ-ureidopropyltriethoxysilane) as silane coupling agents, and 32 parts by weight of Aerosil R972 (a filler having an organic group such as a methyl group, on a surface thereof obtained by coating the silica surface with dimethyldichlorosilane and hydrolyzing the resultant silica in a reactor at 400° C.; manufactured by Nippon Aerosil Co., Ltd.; trade name, silica; average particle diameter: 0.016 μm) as a filler, and mixed by stirring, and further kneaded by means of a beads mill for 90 minutes. To the resultant mixture were added 280 parts by weight of an acrylic rubber containing 3% by weight of glycidyl acrylate or glycidyl methacrylate, HTR-860P-3 (manufactured by Teikoku Chemical Industries Co., Ltd.; trade name, weight average molecular weight: 800,000) and 0.5 part by weight of Curezol 2PZ-CN (manufactured by Shikoku Kasei Kogyo Corporation; trade name, 1-cyanoethyl-2-phenylimidazole) as a curing accelerator, and mixed by stirring, followed by vacuum deaeration. The varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film equipped with a support film.

Sample 12

Completely the same procedure as in the preparation of Sample 11 was conducted except that, instead of 55 parts by weight of YDCN-703, 51 parts by weight of EPON 1031S (trade name, manufactured by Japan Epoxy Resins Co., Ltd.; polyfunctional epoxy resin; epoxy equivalent: 200) was used to prepare an adhesive film.

Sample 13

Completely the same procedure as in the preparation of Sample 11 was conducted except that, instead of 45 parts by weight of Milex XLC-LL, 43 parts by weight of Milex XLC-4L (manufactured by Mitsui Chemicals, Inc.; trade name, phenolic resin; hydroxyl equivalent: 169; water absorption: 1.6%; weight loss by heating at 350° C.: 4%) was used to prepare an adhesive film.

Sample 14

Completely the same procedure as in the preparation of Sample 11 was conducted except that, instead of 45 parts by weight of Milex XLC-LL, 37 parts by weight of Plyofen LF2882 (manufactured by Dainippon Ink & Chemicals, Inc.; trade name, bisphenol A novolak rein; hydroxyl equivalent: 118; water absorption: 4.4%; weight loss by heating at 350° C.: 18%) was used to prepare an adhesive film.
(Comparative Sample 1)
Completely the same procedure as in the preparation of Sample 11 was conducted except that a bisphenol A type bifunctional epoxy resin (YD8125, manufactured by Tohto Kasei Co., Ltd.) was used as an epoxy resin to prepare an adhesive film. Incidentally, the mixture varnish comprising the epoxy resin and the rubber was cast onto a protecting film and dried at 90° C. for 30 minutes to prepare a film (50 μm in thickness). Transmittance of a visible light (600 nm) of the film was 60%, and it was compatible.

With respect to the obtained adhesive films, the tests mentioned below were conducted. The results are shown in Table 4.
(Measurement Method for Peel Strength)
50 μm polyimide films were laminated on both surfaces of the adhesive film by means of a hot roll laminator (80° C., 0.3 m/min, 0.3 MPa), and cured at 170° C. for one hour. The laminated cured product was cut into 10 mm width to prepare a sample for evaluation. By using Tensilon, Model UTM-4-100, manufactured by TOM BALWIN, a value when the sample was subjected to peeling at an angle of 180° at a tensile speed of 50 mm/min was measured. The value was a simple average value of three samples.
(Measurement Method for Elastic Modulus)
An adhesive film having an initial length (L) was prepared, and placed in a thermostatic chamber at 240° C. in a state that a constant load (W) was applied thereto. An amount of elongation (ΔL) and a cross-sectional area (S) of the adhesive film after placing in the chamber were determined and an elastic modulus in tensile (E') was calculated from the following formula:

$$E' = L \cdot W / (\Delta L \cdot S).$$

(Reflow Resistance Test)
A semiconductor chip and a wiring board using a polyimide film having a thickness of 25 μm as a base material were laminated onto the adhesive film and cured to prepare a semiconductor device sample. In accordance with JEDEC standard J-STD-020A, the prepared semiconductor device sample was passed three times through an IR reflow furnace in which the temperature was adjusted so that the maximum temperature of the sample surface became 245° C., 260° C. or 265° C. The resultant sample was observed by visual examination and through an ultrasonic microscope in respect of peeling. A sample in which peeling with a diameter of 1 mm or more was not observed was rated "○", and a sample in which such peeling was observed was rated "X".
(Soldering Heat Resistance Test)
Polyimide films each having a thickness of 50 μm were laminated on both surfaces of the obtained adhesive film using a hot roll laminator under conditions at a temperature of 80° C., a pressure of 0.3 MPa and a speed of 0.3 m/min, and then cured at 170° C. for one hour. Several specimens of 30 mm×30 mm were prepared from the resultant sample, and examined with respect to the heat resistance. The evaluation method for the heat resistance was conducted by a test for resistance to soldering heat after absorbing moisture as follows. A sample was allowed to stand for 48 hours in an environment at 85° C. at a relative humidity of 85%, and then placed in a solder bath at 240° C. to 280° C. The resultant sample was examined whether or not an unfavorable phenomenon such as blistering, occurred until 120 seconds. An adhesive film for which an unfavorable phenomenon was observed in all the samples was rated "X", an adhesive film for which an unfavorable phenomenon was observed in a sample and unfavorable phenomenon was not observed in another was rated "Δ", and an adhesive film for which unfavorable phenomenon was not observed in any of the samples was rated "○".
(PCT Resistance Test)
The evaluation for the PCT resistance was carried out by observing the presence or absence of peeling of the adhesive member after placing it in an atmosphere at a temperature of 121° C., a humidity of 100% and at 2 atm. (pressure cooker test; PCT treatment) for 168 hours.

(Analysis of Islands-in-Sea Structure)

For determining the ratio of the volume VA of the filler contained in the epoxy resin phase to the volume VB of the filler contained in the rubber component phase after being cured, the cross-section of the film was observed through a scanning type electron microscope, and, with respect to each of the regions comprised mainly of A and B, respectively, a peak of the atoms which constitute the filler is measured by means of an XMA. From the height ratio between these peaks, VA/VB is determined.

Also, the islands-in-sea structure was observed by investigating the cross-section of the cured product through a scanning type electron microscope to measure a value of the relationship ($S/V^{1/2}$) between the length S of the outer periphery of the islands phase and the cross-sectional area V.

TABLE 4

| Evaluation | | Sample 11 | Sample 12 | Sample 13 | Sample 14 | Comparative Sample 1 |
|---|---|---|---|---|---|---|
| Peel strength (N/m) | 240° C. | 108 | 74 | 110 | 42 | 11 |
| Elastic modulus (MPa) | 240° C. | 2.9 | 3.6 | 2.8 | 2.4 | 3.8 |
| Soldering heat resistance | 240° C. | ◯ | ◯ | ◯ | ◯ | X |
| | 260° C. | ◯ | ◯ | ◯ | Δ | X |
| | 280° C. | ◯ | Δ | ◯ | Δ | X |
| PCT resistance | | ◯ | ◯ | ◯ | X | X |
| Compatibility | | Incompatible | Incompatible | Incompatible | Incompatible | Compatible |
| VA/VB | | 1.1 | 1.0 | 1.1 | 1.1 | 1.1 |
| $S/V^{1/2}$ | | 3.7 | 3.8 | 3.8 | 3.8 | 3.7 |
| Softening point of Epoxy resin (° C.) | | 80 | 90 | 80 | 80 | 20 to 40 |
| Water absorption of Phenolic resin (%) | | 1.8 | 1.8 | 1.6 | 4.4 | 1.8 |
| Weight loss (350° C.) % | | 4 | 4 | 4 | 18 | 4 |
| Reflow resistance | 245° C. | ◯ | ◯ | ◯ | ◯ | X |
| | 260° C. | ◯ | ◯ | ◯ | X | X |
| | 265° C. | ◯ | ◯ | ◯ | X | X |

As can be seen from Table 4, the adhesive films in Samples 11 to 13 each prepared by using the phenolic resin of formula (I) of the present invention have especially excellent peel strength, as compared to the film in Comparative sample 1, and it can be clearly understood that that the semiconductor devices prepared by using these adhesive films are good in both of resistance to soldering heat after absorbing moisture and PCT resistance.

Example 4

Sample 15

Methyl ethyl ketone was added to a composition comprising 45 parts by weight of a bisphenol A type epoxy resin (epoxy equivalent: 190, EPIKOTE 828, manufactured by Japan Epoxy Resins Co., Ltd. was used) and 15 parts by weight of a cresol novolak type epoxy resin (epoxy equivalent: 195, ESCN195, manufactured by Sumitomo Chemical Co., Ltd. was used) as epoxy resins, 40 parts by weight of a phenolic novolak resin (Plyofen LF2882, manufactured by Dainippon Ink & Chemicals, Inc. was used) as a curing agent for the epoxy resins, 0.7 part by weight of γ-glycidoxypropyltrimethoxysilane (NUC A-187 manufactured by Nippon Unicar Co., Ltd. was used) as a silane coupling agent, and 10 parts by weight of silica filler (NanoTek $SiO_2$ manufactured by C.I. KASEI CO., LTD. was used; contact angle with water: 43 degrees; average particle diameter: 0.012 μm), and mixed by stirring, and further kneaded by means of a beads mill for 90 minutes. To the resultant mixture were added 150 parts by weight of an acrylic rubber containing 2 to 6% by weight of glycidyl acrylate or glycidyl methacrylate and having a weight average molecular weight of 100,000 or more (molecular weight: 1,000,000, HTR-860P-3 manufactured by Teikoku Chemical Industries Co., Ltd. was used) and 0.5 part by weight of 1-cyanoethyl-2-phenylimidazole (Curezol 2PZ-CN, manufactured by Shikoku Kasei Kogyo Corporation was used) as a curing accelerator, and mixed by means of a stirring motor for 30 minutes to obtain a varnish. The varnish was coated onto a release-treated polyethylene terephthalate film having a thickness of 75 μm, and dried by heating to 140° C. for 5 minutes to form a coating film in a B-stage having a thickness of 75 μm, thus preparing an adhesive film equipped with a support film.

Sample 16

Methyl ethyl ketone was added to a composition comprising 60 parts by weight of a cresol novolak type epoxy resin (epoxy equivalent: 210, YDCN-703 manufactured by Tohto Kasei Co., Ltd. was used) as an epoxy resin, 40 parts by weight of a phenolic novolak resin (Plyofen LF2882 manufactured by Dainippon Ink & Chemicals, Inc. was used) as a curing agent for the epoxy resin, 200 parts by weight of an acrylic rubber containing 2 to 6% by weight of glycidyl acrylate or glycidyl methacrylate (weight average molecular weight: 1,000,000, HTR-860E-3 manufactured by Teikoku Chemical Industries Co., Ltd. was used), 0.5 part by weight of 1-cyanoethyl-2-phenylimidazole (Curezol 22Z-CN was used) as a curing accelerator, 0.7 part by weight of γ-ureidopropyltriethoxysilane (NUC A-1160 manufactured by Nippon Unicar Co., Ltd. was used) as a silane coupling agent, and 10 parts by weight of silica filler (NanoTek $SiO_2$ manufactured by C.I. KASEI CO., LTD. was used; contact angle with water: 43 degrees; average particle diameter: 0.012 μm), and mixed by stirring, and further kneaded by means of a beads mill, followed by vacuum deaeration. The varnish was coated onto a release-treated polyethylene terephthalate film having a thickness of 75 μm, and dried by heating to 140° C. for 5 minutes to form a coating film in a B-stage having a thickness of 75 μm, thus preparing an adhesive film equipped with a support film.

Sample 17

Substantially the same procedure as in the preparation of Sample 15 was conducted except that 15 parts by weight of silica (Aerosil 50 manufactured by Nippon Aerosil Co., Ltd.; contact angle: 95 degrees; average particle diameter: 0.03 μm) was used as a filler to prepare an adhesive film.

Sample 18

Substantially the same procedure as in the preparation of Sample 15 was conducted except that 15 parts by weight of diantimony trioxide (PATOX-U manufactured by Nihon Mining & Concentrating Co., Ltd.; contact angle with water: 43 degrees; average particle diameter: 0.02 μm) was used as a filler to prepare an adhesive film.

When the sample was observed through a scanning type electron microscope with respect to VA/VB in the same manner as in Example 3, it was 2.5.

Sample 19

Substantially the same procedure as in the preparation of Sample 15 was conducted except that 15 parts by weight of diantimony trioxide (PATOX-HS manufactured by Nihon Mining & Concentrating Co., Ltd.; contact angle with water: 43 degrees; average particle diameter: 5 μm) was used as a filler to prepare an adhesive film.

When the sample was observed through a scanning type electron microscope with respect to $S/V^{1/2}$ in the same manner as in Example 3, it was 4.0.

Sample 20

Substantially the same procedure as in the preparation of sample 15 was conducted except that silica filler, Aerosil R972, manufactured by Nippon Aerosil Co., Ltd. (a filler having an organic group such as a methyl group, on a surface thereof obtained by coating the silica surface with dimethyldichlorosilane and hydrolyzing the resultant silica in a reactor at 400° C.; contact angle with water: 160 degrees; average particle diameter: 0.02 μm) was used as a filler to prepare an adhesive film.

Polyimide films each having a thickness of 50 μm were laminated on both surfaces of the obtained adhesive film using a hot roll laminator under conditions at a temperature of 80° C., a pressure of 0.3 MPa and a speed of 0.3 m/min, and then cured at 170° C. for one hour. The resultant sample was examined with respect to the heat resistance. The evaluation method for the heat resistance was conducted by a test for resistance to soldering heat after absorbing moisture as follows. A sample was allowed to stand for 48 hours in an environment at a temperature of 85° C., a relative humidity of 85%, and then placed in a solder bath at 240° C. A sample in which blistering was observed less than 40 seconds was rated "X", a sample in which blistering was observed 40 seconds or more to less than 120 seconds was rated "○", and a sample in which no blistering was observed in 120 seconds or more was rated "⊚".

The evaluation for the moisture resistance was made as follows. A sample was placed in an atmosphere at a temperature of 121° C., a humidity of 100% and at 2 atm. (pressure cooker test; PCT treatment), and then, observed every 100 hours in respect of peeling of the adhesive member. A sample in which no peeling was observed in the adhesive member was rated "○", and a sample in which peeling was observed in the adhesive member was rated "X". The results are shown in Table 5.

TABLE 5

| | Sample 15 | Sample 16 | Sample 17 | Sample 18 | Sample 19 | Sample 20 |
|---|---|---|---|---|---|---|
| Compatibility | Incompatible | Incompatible | Incompatible | Incompatible | Incompatible | Incompatible |
| Soldering heat resistance after moisture absorption | ⊚ | ⊚ | ⊚ | ⊚ | ⊚ | ○ |
| PCT 100 hr | ○ | ○ | ○ | ○ | ○ | ○ |
| PCT 200 hr | ○ | ○ | ○ | ○ | ○ | ○ |
| PCT 300 hr | ○ | ○ | ○ | ○ | ○ | ○ |
| PCT 400 hr | ○ | ○ | ○ | X | X | X |

Samples 15 to 19 are adhesive films using an inorganic filler having a contact angle with water of 100 degrees or less, and the semiconductor device produced by using these adhesive films were good both in resistance to soldering heat after absorbing moisture and PCT resistance. Sample 18 using a filler having an average particle diameter of 0.02 μm has good PCT resistance as compared to Sample 19 using a filler having an average particle diameter of 5 μm. Sample 20 is a sample in which a filler having a large contact angle with water was used.

Example 5

Sample 21

Methyl ethyl ketone was added to a resin comprising 45 parts by weight of a bisphenol A type epoxy resin (epoxy equivalent: 190, EPIKOTE 828 manufactured by Japan Epoxy Resins Co., Ltd. was used) and 151 parts by weight of a cresol novolak type epoxy resin (epoxy equivalent: 195, ESCN195 manufactured by Sumitomo Chemical Co., Ltd. was used) as epoxy resins, and 40 parts by weight of a phenolic novolak resin (Plyofen LF2882 manufactured by Dainippon Ink & Chemicals, Inc. was used) as a curing agent for the epoxy resins, was added 10 parts by weight of antimony oxide filler having an average particle diameter of 0.02 μm (PATOX-U manufactured by Nihon Mining & Concentrating Co., Ltd. was used), and then, 0.7 part by weight of γ-glycidoxypropyltrimethoxysilane (NUC A-187 manufactured by Nippon Unicar Co., Ltd. was used) as a silane coupling agent, and mixed by stirring, and further kneaded by means of a beads mill for 90 minutes. To the resultant mixture were added 150 parts by weight of an acrylic rubber containing 2 to 6% by weight of glycidyl acrylate or glycidyl methacrylate and having a weight average molecular weight of 100,000 or more (molecular weight: 1,000,000, HTR-860P-3 manufactured by Teikoku Chemical Industries Co., Ltd. was used) and 0.5 part by weight of 1-cyanoethyl-2-phenylimidazole (Curezol 2PZ-CN manufactured by Shikoku Kasei Kogyo Corporation was used) as a curing accelerator, and mixed by means of a stirring motor for 30 minutes to obtain a varnish. The varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film equipped with a support film. The cross-section of the prepared film was observed through a scanning type electron microscope. As a result, islands comprised of the epoxy resin having a diameter of 1 μm and a sea comprised of the rubber were observed. The ratio (VA/VB) of the amount VA of antimony atoms in the islands portion to the amount VB of antimony atoms in the sea portion was analyzed by means of an XMA, and it was found to be 3. Also, when $S/V^{1/2}$ of the sample was observed through a scanning type electron microscope in the same manner as in Example 3, it was 4.1.

Sample 22

Substantially the same procedure as in the preparation of sample 21 was conducted except that the epoxy resin and the rubber were firstly mixed together and then the filler was added thereto to prepare a film. From an analysis by means of an XMA, it was found that VA/VB is 1.1. Also, when $S/V^{1/2}$ of the sample was observed through a scanning type electron microscope in the same manner as in Example 3, it was 4.0.

Polyimide films each having a thickness of 50 μm were laminated on both surfaces of each of the adhesive films in Samples 21 and 22 using a hot roll laminator under conditions at a temperature of 80° C., a pressure of 0.3 MPa and a speed of 0.3 m/min, and then cured at 170° C. for one hour. The resultant sample was examined with respect to the heat resistance and PCT resistance. The evaluation method for the heat resistance was conducted by a test for resistance to soldering heat after absorbing moisture as follows. A sample was allowed to stand for 48 hours in an environment at 85° C./a relative humidity of 85%, and then placed in a solder bath at 240° C. A sample in which blistering was observed less than 40 seconds was rated "X", a sample in which blistering was observed 40 seconds or more to less than 120 seconds was rated "○", and a sample in which no blistering was observed in 120 seconds or more was rated "◉". In addition, the evaluation for the moisture resistance was made as follows. A sample was placed in an atmosphere at a temperature of 121° C., a humidity of 100% and at 2 atm. (pressure cooker test; PCT treatment), and then, observed every 100 hours in respect of peeling of the adhesive member. A sample in which no peeling was observed in the adhesive member was rated "○", and a sample in which peeling was observed in the adhesive member was rated "X". The results are shown in Table 6.

TABLE 6

| | Sample 21 | Sample 22 |
|---|---|---|
| Compatibility | Incompatible | Incompatible |
| Soldering heat resistance after moisture absorption | ◉ | ○ |
| PCT 100 hr | ○ | ○ |
| PCT 200 hr | ○ | ○ |
| PCT 300 hr | ○ | X |
| PCT 400 hr | X | X |

From the above, it can be understood that, by preliminarily mixing the epoxy resin with the filler, a larger amount of the filler can be incorporated into the epoxy resin phase, whereby making it possible to improve the heat resistance and moisture resistance as well as reliability.

Example 6

Sample 23

Methyl ethyl ketone was added to a composition comprising 17.2 g of a bisphenol A type epoxy resin (epoxy equivalent: 190, EPIKOTE 828 manufactured by Yuka Shell Epoxy Co., Ltd. was used) and 5.8 g of a cresol novolak type epoxy resin (epoxy equivalent: 195, ESCN195 manufactured by Sumitomo Chemical Co., Ltd. was used) as epoxy resins, 15.3 g of a phenolic novolak resin (Plyofen LF2882 manufactured by Dainippon Ink & Chemicals, Inc. was used) as a curing agent for the epoxy resins, 0.2 g of γ-glycidoxypropyltrimethoxysilane (NUC A-187 manufactured by Nippon Unicar Co., Ltd. was used) as a silane coupling agent, and 3.8 g of silica filler (NanoTek $SiO_2$ (average particle diameter: 0.012 μm) manufactured by C.I. KASEI CO., LTD. was used), and mixed by stirring, and further kneaded by means of a beads mill for 90 minutes.

To the resultant mixture were added 57.5 g of an epoxy-containing acrylic rubber (weight average molecular weight: about 700,000, HTR-860P-3 manufactured by Teikoku Chemical Industries Co., Ltd. was used) and 0.2 g of 1-cyanoethyl-2-phenylimidazole (Curezol 2PZ-CN manufactured by Shikoku Corporation was used) as a curing accelerator, and mixed by means of a stirring motor for 30 minutes. The resultant varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film equipped with a support film.

The weight average molecular weight was measured by a GPC method using the following apparatus and columns and using a calibration curve obtained by standard polystyrene.
(GPC Measurement)
Apparatus: Model HPLC635 manufactured by Hitachi, Ltd.
Columns: Gel pack R-440, R-450 and R-400M manufactured by Hitachi Chemical Co., Ltd.

Sample 24

Methyl ethyl ketone was added to a composition comprising 19.3 g of a cresol novolak type epoxy resin (epoxy equivalent: 210, YDCN-703 manufactured by Tohto Kasei Co., Ltd. was used) as an epoxy resin, 12.9 g of a cresol novolak resin (Plyofen LF2882 manufactured by Dainippon Ink & Chemicals, Inc. was used) as a curing agent for the epoxy resin, 64.3 g of an epoxy-containing acrylic rubber (weight average molecular weight: about 700,000, HTR-860P-3 manufactured by Teikoku Chemical Industries Co., Ltd. was used) as an epoxy group-containing acrylic copolymer, 0.2 g of 1-cyanoethyl-2-phenylimidazole (Curezol 2PZ-CN manufactured by Shikoku Corporation was used) as a curing accelerator, 0.3 g of γ-ureidopropyltriethoxysilane (NUC A-1160 manufactured by Nippon Unicar Co., Ltd. was used) as a silane coupling agent, and 3.0 g of silica filler (NanoTek $SiO_2$ (average particle diameter: 0.012 μm) manufactured by C.I. KASEI CO., LTD. was used), and mixed by stirring, and further kneaded by means of a beads mill for 90 minutes.

The varnish was coated onto a release-treated polyethylene terephthalate film having a thickness of 75 μm, and dried by heating at 140° C. for 5 minutes to form a coating film in a B-stage having a thickness of 75 μm, thus preparing an adhesive film having a support film. The weight average molecular weight was measured in the same manner as in the preparation of Sample 23.

Sample 25

Substantially the same procedure as in the preparation of sample 23 was conducted except that 3.8 g of silica (Aerosil 50 (average particle diameter is 0.03 µm) manufactured by Nippon Aerosil Co., Ltd.) was used as a filler to prepare an adhesive film.

Sample 26

Substantially the same procedure as in the preparation of Sample 23 was conducted except that 3.8 g of diantimony trioxide (PATOX-U (average particle diameter is 0.02 µm) manufactured by Nihon Mining & Concentrating Co., Ltd.) was used as a filler to prepare an adhesive film.
(Comparative Sample 2)
Substantially the same procedure as in the preparation of Sample 23 was conducted except that 0.05 g of diantimony trioxide (PATOX-U (average particle diameter is 0.02 µm) manufactured by Nihon Mining & Concentrating Co., Ltd.) was used as a filler to prepare an adhesive film.

With respect to each of the adhesive films obtained under different conditions, a volume percentage of the pores in the film was determined by making calculation in accordance with the following method.
(1) In a view through a SEM, S-4500, manufactured by Hitachi Ltd., a square region, having a side with a length of 100 times the average particle diameter of the filler used and which has 50 pores, is selected to take a SEM photograph.
(2) The area of the square region and the total area of the 50 pores are determined as follows. A transparent film having a uniform density and an even thickness is placed on the SEM photograph, and all the 50 pores are traced by a pen and the traced portions are cut out.
(3) The predetermined area portion (including the 50 pores portions) is traced by a pen in the same manner as in item (2) above, and the traced portion is cut out.
(4) The weight of each of the cut out portions obtained in items (2) and (3) above is measured to determine a (2)/(3) value.
(5) $V=[(2)/(3)]^{3/2}$ is determined.
(6) The sequence of the operations of items (1) to (5) above is repeated five times, and an average of V values obtained is taken as a volume percentage, and the results are shown in Table 7.

Further, polyimide films each having a thickness of 50 µm were laminated on both surfaces of each of the adhesive films using a hot roll laminator under conditions at a temperature of 80° C., a pressure of 0.3 MPa and a conveying speed of 0.3 m/min, and then cured at 170° C. for one hour. The resultant samples were individually examined with respect to the heat resistance and PCT resistance (pressure cooker test).

The evaluation method for heat resistance was conducted by a test for resistance to soldering heat after absorbing moisture as follows. A sample was allowed to stand for 48 hours in an environment at 85° C./a relative humidity of 85%, and then placed in a solder bath at 240° C. A sample in which blistering was observed less than 40 seconds was rated "X", a sample in which blistering was observed 40 seconds or more to less than 120 seconds was rated "○", and a sample in which no blistering was observed in 120 seconds or more was rated "⊚".

The evaluation for the PCT resistance was made as follows. A sample was treated in an atmosphere at 121° C., 2 atm. and a humidity of 100% for a predetermined time, and then, observed in respect of appearance. A sample in which an unfavorable phenomenon such as blistering, was not observed was rated "○", and a sample in which an unfavorable phenomenon was observed was rated "X".

The contact angle a of filler with water was measured as follows. A filler was subjected to compression molding to prepare a plane plate, and a water drop was placed on the plate and the angle of the water drop to the plate was measured by means of a contact angle meter. This measurement was repeated 10 times to obtain an average value, and this value was used as a value of the contact angle. The contact angle b with water of the material obtained by applying the composition and drying the composition applied was measured in the same manner as in contact angle a.

TABLE 7

| | Sample 23 | Sample 24 | Sample 25 | Sample 26 | Comparative Sample 2 |
|---|---|---|---|---|---|
| Compatibility | Incompatible | Incompatible | Incompatible | Incompatible | Incompatible |
| Contact angle of filler with water (° C.): a | 43.2 | 43.2 | 96.5 | 41.7 | 128.0 |
| Contact angle of resin with water (° C.): b | 144.0 | 128.0 | 144.0 | 144.0 | 144.0 |
| Ratio of Contact angle (a/b) | 0.30 | 0.33 | 0.67 | 0.29 | 0.88 |
| Existence of pores of 0.1 to 2.0 µm | Present | Present | Present | Present | Present |
| Volume content of pores (vol %) | 2.8 | 1.9 | 2.4 | 3.6 | 0.01 |
| Soldering heat resistance after moisture absorption | ⊚ | ⊚ | ○ | ○ | X |
| PCT 100 hr | ○ | ○ | ○ | ○ | ○ |
| PCT 200 hr | ○ | ○ | ○ | ○ | X |
| PCT 300 hr | ○ | ○ | ○ | ○ | X |
| PCT 400 hr | ○ | ○ | ○ | ○ | X |
| PCT 500 hr | ○ | ○ | X | X | X |

Samples 23 to 26 are adhesive films in which 0.01 to 2.0 µm pores were present therein in the range of 0.1 to 20% by volume, and the laminates for semiconductor produced by using these adhesive films had excellent resistance to soldering heat after absorbing moisture and had a POT resistance of 300 to 400 hours.

Further, Sample 24 employs silica as filer and does not employ a bisphenol A type epoxy resin having a mutagen. Therefore, the sample is advantageous not only in that it is easy to handle but also in that it has excellent resistance to soldering heat after absorbing moisture and good PCT resistance as much as Sample 23, while maintaining characteristics of having less adverse effect on the environment and human body.

Comparative sample 2 has pores outside the range of 0.1 to 20% by volume, and is insufficient in resistance to soldering heat after absorbing moisture and has a PCT resistance of 100 hours, which is far shorter than those of Samples 23 to 26.

Also, Samples 23 to 26 are adhesive films having a contact angle ratio (a/b) of less than ¾, i.e., less than 0.75, and the semiconductor devices prepared by using these adhesive films had excellent resistance to soldering heat after absorbing moisture and a PCT resistance as good as 400 hours or more.

Comparative sample 2 has a contact angle ratio of 0.75 or more, and is insufficient in resistance to soldering heat after absorbing moisture and a PCT resistance of 100 hours, which is far shorter than those of Samples 23 to 26.

INDUSTRIAL APPLICABILITY

By virtue of having the above-mentioned construction, the adhesive composition of the present invention has excellent moisture resistance, reflow crack resistance and heat resistance. Also, by further adding an inorganic filler, there can be obtained an adhesive composition which is advantageous in that it is improved both in elastic modulus at high temperatures and peel strength at high temperatures to exhibit an effect of preventing reflow crack and thus excellent in reflow crack resistance. Further, by using the adhesive composition of the present invention, an adhesive film excellent in heat resistance and PCT resistance can be produced. The adhesive film of the present invention is excellent in heat resistance after absorbing moisture, reflow resistance, adhesion properties after absorbing moisture, etc.

Also, the adhesive film and the wiring board for mounting semiconductor each produced from the adhesive composition of the present invention, and the semiconductor device produced by using the same have excellent heat resistance and POT resistance. According to the present invention, there can be provided an adhesive composition from which an adhesive member can be formed wherein the adhesive member is advantageous not only in that the adhesive member has heat resistance and moisture resistance necessary for mounting a semiconductor device on a substrate for mounting semiconductor even when the difference in coefficient of thermal expansion between the semiconductor device and the substrate is large, but also in that the adhesive member can suppress volatilization of the volatile components when being used, an adhesive member, a substrate for mounting semiconductor, and a semiconductor device which use the adhesive composition.

What is claimed is:

1. A semiconductor device, manufactured by a process in which:
   (1) an adhesive film and a dicing tape are laminated to a semiconductor wafer, and then,
   (2) the resultant wafer and adhesive film are cut into a chip, and
   (3) (i) a substrate having a circuit or a film having a circuit and (ii) the chip are adhered through said adhesive film, wherein said adhesive film includes a cured product of an adhesive composition comprising:
   (a) at least one epoxy resin;
   (b) a curing agent; and
   (c) an epoxy group-containing acrylic copolymer, and
   wherein (b) the curing agent is a phenolic resin having a hydroxyl equivalent of 150 g/eq or more.

2. The semiconductor device according to claim 1, wherein (b) the curing agent is a phenolic resin represented by the following general formula (I):

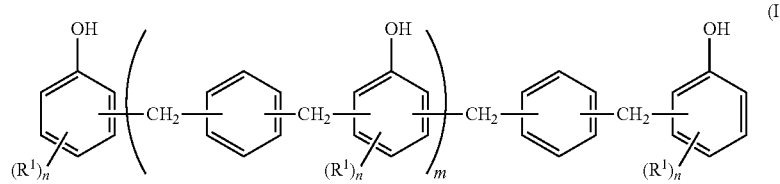

wherein $R^1$ each may be the same or different from each other and represents a hydrogen atom, a straight or branched alkyl group having 1 to 10 carbon atoms, a cyclic alkyl group, an aralkyl group, an alkenyl group, a hydroxyl group, an aryl group, or a halogen atom; n represents an integer of 1 to 3; and m represents an integer of 0 to 50.

3. The semiconductor device according to claim 1, wherein said adhesive film is adhered to a support film when laminating the adhesive film to the semiconductor wafer, and wherein the support film is a plastic film selected from the group consisting of a polytetrafluoroethylene film, a polyethylene terephthalate film, a polyethylene film, a polypropylene film, a polymethylpentene film, and a polyimide film.

4. The semiconductor device according to claim 3, wherein surfaces of the support film are release-treated.

5. The semiconductor device according to claim 3, wherein said adhesive film is adhered to the semiconductor wafer in laminating the adhesive film and the dicing tape to the semiconductor wafer, and the support film is removed from the adhesive film after adhering the adhesive film to the semiconductor wafer.

6. The semiconductor device according to claim 1, wherein said chip includes wire bonding.

7. The semiconductor device according to claim 1, wherein the adhesive film is adhered to a support film when laminating the adhesive film to the semiconductor wafer, and wherein surfaces of the support film are release-treated.

8. The semiconductor device according to claim 1, wherein the adhesive film is adhered to a support film when laminating the adhesive film to the semiconductor wafer, and wherein said adhesive film is adhered to the semiconductor wafer when laminating the adhesive film and the dicing tape to the semiconductor wafer, and the support film is removed from the adhesive film after adhering the adhesive film to the semiconductor wafer.

9. The semiconductor device according to claim 1, wherein said at least one epoxy resin is at least one selected from the group consisting of a phenol novolak epoxy resin and a cresol novolak epoxy resin.

10. The semiconductor device according to claim 1, wherein said epoxy group-containing acrylic copolymer is incompatible with at least one of the epoxy resins.

* * * * *